US009135907B2

(12) United States Patent
Fellers et al.

(10) Patent No.: US 9,135,907 B2
(45) Date of Patent: Sep. 15, 2015

(54) METHOD AND APPARATUS FOR REDUCING THE EFFECT OF ENVIRONMENTAL NOISE ON LISTENERS

(75) Inventors: Matthew C. Fellers, San Francisco, CA (US); Alan J. Seefeldt, San Francisco, CA (US); Brett G. Crockett, Brisbane, CA (US); Grant A. Davidson, Burlingame, CA (US); Louis D. Fielder, Millbrae, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 346 days.

(21) Appl. No.: 13/703,844

(22) PCT Filed: Jun. 16, 2011

(86) PCT No.: PCT/US2011/040625
§ 371 (c)(1),
(2), (4) Date: Dec. 12, 2012

(87) PCT Pub. No.: WO2011/159858
PCT Pub. Date: Dec. 22, 2011

(65) Prior Publication Data

US 2013/0083939 A1 Apr. 4, 2013

Related U.S. Application Data

(60) Provisional application No. 61/355,953, filed on Jun. 17, 2010.

(51) Int. Cl.
*G10K 11/16* (2006.01)
*H03B 29/00* (2006.01)
(Continued)

(52) U.S. Cl.
CPC ............ *G10K 11/002* (2013.01); *G10K 11/178* (2013.01); *H04R 1/1008* (2013.01); *H04R 1/1083* (2013.01); *H04R 3/005* (2013.01);
(Continued)

(58) Field of Classification Search
None
See application file for complete search history.

(56) References Cited

U.S. PATENT DOCUMENTS 4,677,677 A 6/1987 Eriksson
5,251,263 A 10/1993 Andrea
(Continued)

FOREIGN PATENT DOCUMENTS

CN 1738488 2/2006
CN 101394381 3/2009
(Continued)

OTHER PUBLICATIONS

Gan, W.S et al. "Adaptive Noise Equalizer with Equal-Loudness Compensation" Circuits and Systems, 2005, Symposium in IEEE, p. 276-279, vol. 1.

*Primary Examiner* — Regina N Holder

(57) ABSTRACT

A method and apparatus for enhancing a desired audio signal for delivery through an electroacoustic channel include obtaining a noise estimate attributable to an external disturbance, applying the noise estimate to a dynamic noise compensation (DNC) process to thereby condition the desired audio signal as a function of the spectral characteristics of the noise estimate, applying the noise estimate to an adaptive equalization (AEQ) process to thereby condition the desired audio signal as a function of the electroacoustic response of the electroacoustic channel, and applying the noise estimate to an active noise cancellation (ANC) process configured to generate anti-noise for delivery into the electroacoustic channel.

20 Claims, 9 Drawing Sheets

(51) Int. Cl.

| | |
|---|---|
| ***A61F 11/06*** | (2006.01) |
| ***G10K 11/00*** | (2006.01) |
| ***G10K 11/178*** | (2006.01) |
| ***H04R 1/10*** | (2006.01) |
| ***H04R 3/00*** | (2006.01) |
| *G10L 21/0208* | (2013.01) |

(52) U.S. Cl.
CPC ..... *G10K2210/1081* (2013.01); *G10L 21/0208* (2013.01); *H04R 2420/01* (2013.01)

(56) References Cited

U.S. PATENT DOCUMENTS

| | | | | |
|---|---|---|---|---|
| 5,553,153 | A | 9/1996 | Eatwell | |
| 5,627,746 | A | 5/1997 | Ziegler, Jr. | |
| 5,852,667 | A | 12/1998 | Pan | |
| 6,418,227 | B1 | 7/2002 | Kuo | |
| 7,050,966 | B2 | 5/2006 | Schneider | |
| 2003/0036902 | A1 | 2/2003 | Gadde | |
| 2005/0141731 | A1 * | 6/2005 | Hamalainen | 381/94.3 |
| 2005/0207583 | A1 | 9/2005 | Christoph | |
| 2005/0207585 | A1 | 9/2005 | Christoph | |
| 2006/0262938 | A1 | 11/2006 | Gauger | |
| 2007/0098119 | A1 | 5/2007 | Stothers | |
| 2007/0156262 | A1 | 7/2007 | Craven | |
| 2008/0269926 | A1 | 10/2008 | Xiang | |
| 2011/0142247 | A1 | 6/2011 | Fellers | |

FOREIGN PATENT DOCUMENTS

| | | |
|---|---|---|
| JP | 5-35284 | 2/1993 |
| JP | H11-305784 | 11/1999 |
| JP | 2001-005463 | 1/2001 |
| WO | 99/11045 | 3/1999 |
| WO | 2007/073818 | 7/2007 |
| WO | 2008/090342 | 7/2008 |
| WO | 2008/096125 | 8/2008 |
| WO | 2009/041012 | 4/2009 |

* cited by examiner

METHOD AND APPARATUS FOR REDUCING THE EFFECT OF ENVIRONMENTAL NOISE ON LISTENERS

CROSS-REFERENCE TO RELATED APPLICATIONS

This application is the National Stage of International Application No. PCT/US2011/040625 having an international filing date of Jun. 16, 2011 and claims priority to U.S. Patent Provisional Application No. 61/355,953, filed Jun. 17, 2010, each of which is hereby incorporated by reference in its entirety.

TECHNICAL FIELD

The present disclosure relates generally to the presentation of audio playback to a listener, and more particularly, to the mitigation of the effects of ambient noise on such playback.

BACKGROUND

With the proliferation of audio playback devices in use today, demand is rising for improved quality from these devices. One factor that can significantly affect the perceived audio quality of a playback device is the presence and audibility of background or environmental noise. This problem exists for most, if not all, classes of playback devices, whether they employ a built-in or detached speaker or speakers, transmit the audio signal wirelessly to a single earpiece (for example, Bluetooth™ headsets), or transmit the audio signal to stereo headphones, either wirelessly or via a standard or proprietary wired connection. Many products currently on the market offer active noise cancellation (ANC) technology which attempts to acoustically cancel some of the background or environmental noise in the electroacoustic channel at the entrance to the ear canal. The acoustic signal at the entrance to the ear canal is acquired through a small microphone placed in close proximity to the speaker (driver) such that said microphone is capable of sensing the signal played out through the driver, as well as the ambient environmental noise. The amount and bandwidth of noise cancellation varies significantly depending on the ANC technique used. However, due to fundamental limitations of existing ANC techniques, they generally do not provide significant noise reduction for frequencies above about 1 kHz, and may even, in some cases, increase noise levels of frequencies above 1 kHz.

Another technology currently available for reducing the effects of noisy ambient environments is dynamic noise compensation (DNC). In this technology, the spectral characteristics of the ambient noise from the environment are analyzed, and the playback level of the audio signal is selectively adjusted in response. In spectral regions in which the background noise is not deemed distracting, the audio signal is left largely unmodified. However, in spectral regions in which the background noise level is high enough to negatively affect the perceived quality or audibility of the audio signal, a level adjustment is made to the audio signal to improve the audio quality for the listener.

A third process for improving fidelity to the original signal is the use of equalization, which operates to correct the frequency response of the electroacoustic channel using inverse filtering techniques referred to as adaptive equalization (AEQ).

OVERVIEW

Described herein is a method for enhancing a desired audio signal for delivery through an electroacoustic channel includes obtaining a noise estimate attributable to an external disturbance, applying the noise estimate to a dynamic noise compensation (DNC) process to thereby condition the desired audio signal as a function of the spectral characteristics of the noise estimate, and applying the noise estimate to an adaptive equalization (AEQ) process to thereby condition the desired audio signal as a function of the electroacoustic response of the electroacoustic channel.

Also described herein is a method for enhancing a desired audio signal for delivery through an electroacoustic channel includes obtaining a noise estimate attributable to an external disturbance, applying the noise estimate to a dynamic noise compensation (DNC) process to thereby condition the desired audio signal as a function of the spectral characteristics of the noise estimate, applying the noise estimate to an adaptive equalization (AEQ) process to thereby condition the desired audio signal as a function of the electroacoustic response of the electroacoustic channel, and applying the noise estimate to an active noise cancellation (ANC) process configured to generate anti-noise for delivery into the electroacoustic channel.

Also described herein is a method for enhancing a desired audio signal for delivery through an electroacoustic channel using a driver includes obtaining a noise estimate based on an external disturbance, generating a dynamic noise compensation (DNC)-conditioned signal by conditioning the desired audio signal as a function of the spectral characteristics of the noise estimate, generating an anti-noise signal using the noise estimate, generating a composite signal from the DNC-conditioned signal and the anti-noise signal, and driving the driver using the composite signal.

Also described herein is a method for enhancing a desired audio signal for delivery through an electroacoustic channel using a driver in the presence of a noise disturbance, the method including obtaining a first noise estimate based on the external disturbance, obtaining a second noise estimate based on the external disturbance, generating a DNC-conditioned signal by conditioning the desired audio signal as a function of the spectral characteristics of the first noise estimate, generating an anti-noise signal using the first and second noise estimates, generating a composite signal from the DNC-conditioned signal and the anti-noise signal, and driving the driver using the composite signal, wherein the first noise estimate contains an anti-noise component but no DNC-conditioned component.

Also described herein is an audio enhancement system for enhancing a desired audio signal includes a dynamic noise compensation (DNC) module configured to generate a DNC-conditioned signal, the DNC module including a spectral shaping filter operable to apply spectral shaping to the desired audio signal based on spectral characteristics of a first noise estimate, and an adaptive equalization (AEQ) module configured to generate an AEQ-conditioned signal, the AEQ module including an adaptive equalization control filter operable to receive the DNC-conditioned signal and apply thereto adaptive equalization as a function of the first noise estimate.

Also described herein is an audio enhancement system for enhancing a desired audio signal for delivery through an electroacoustic channel includes a dynamic noise compensation (DNC) module configured to generate a DNC-conditioned signal, the DNC module including a spectral shaping filter operable to apply spectral shaping to the desired audio signal based on spectral characteristics of a first noise estimate, an active noise cancellation (ANC) module including a control filter having filter characteristics updatable by the first noise estimate and having a first input for receiving a second noise estimate and generating therefrom an anti-noise signal, and a first combiner for combining the DNC-conditioned signal and the anti-noise signal to generate a composite signal.

Also described herein is a system for enhancing a desired audio signal for delivery through an electroacoustic channel that includes means for obtaining a noise estimate attributable to an external disturbance, means for applying the noise estimate to a dynamic noise compensation (DNC) process to thereby condition the desired audio signal as a function of the spectral characteristics of the noise estimate, and means for applying the noise estimate to an adaptive equalization (AEQ) process to thereby condition the desired audio signal as a function of the electroacoustic response of the electroacoustic channel.

Also described herein is a system for enhancing a desired audio signal for delivery through an electroacoustic channel that includes means for obtaining a noise estimate attributable to an external disturbance, means for applying the noise estimate to a dynamic noise compensation (DNC) process to thereby condition the desired audio signal as a function of the spectral characteristics of the noise estimate, means for applying the noise estimate to an adaptive equalization (AEQ) process to thereby condition the desired audio signal as a function of the electroacoustic response of the electroacoustic channel, and means for applying the noise estimate to an active noise cancellation (ANC) process configured to generate anti-noise for delivery into the electroacoustic channel.

Also described herein is a system for enhancing a desired audio signal for delivery through an electroacoustic channel using a driver. The system includes means for obtaining a noise estimate based on an external disturbance, means for generating a dynamic noise compensation (DNC)-conditioned signal by conditioning the desired audio signal as a function of the spectral characteristics of the noise estimate, means for generating an anti-noise signal using the noise estimate, means for generating a composite signal from the DNC-conditioned signal and the anti-noise signal, and means for driving the driver using the composite signal.

Also described herein is a system for enhancing a desired audio signal for delivery through an electroacoustic channel using a driver in the presence of a noise disturbance, the system including means for obtaining a first noise estimate based on the external disturbance, means for obtaining a second noise estimate based on the external disturbance, means for generating a DNC-conditioned signal by conditioning the desired audio signal as a function of the spectral characteristics of the first noise estimate, means for generating an anti-noise signal using the first and second noise estimates, means for generating a composite signal from the DNC-conditioned signal and the anti-noise signal, and means for driving the driver using the composite signal. The first noise estimate contains an anti-noise component but no DNC-conditioned component.

Also described herein is a program storage device readable by a machine, embodying a program of instructions executable by the machine to perform a method for enhancing a desired audio signal for delivery through an electroacoustic channel. The method includes obtaining a noise estimate attributable to an external disturbance, applying the noise estimate to a dynamic noise compensation (DNC) process to thereby condition the desired audio signal as a function of the spectral characteristics of the noise estimate, and applying the noise estimate to an adaptive equalization (AEQ) process to thereby condition the desired audio signal as a function of the electroacoustic response of the electroacoustic channel.

Also described herein is a program storage device readable by a machine, embodying a program of instructions executable by the machine to perform a method for enhancing a desired audio signal for delivery through an electroacoustic channel. The method includes obtaining a noise estimate attributable to an external disturbance, applying the noise estimate to a dynamic noise compensation (DNC) process to thereby condition the desired audio signal as a function of the spectral characteristics of the noise estimate, applying the noise estimate to an adaptive equalization (AEQ) process to thereby condition the desired audio signal as a function of the electroacoustic response of the electroacoustic channel, and applying the noise estimate to an active noise cancellation (ANC) process configured to generate anti-noise for delivery into the electroacoustic channel.

Also described herein is a program storage device readable by a machine, embodying a program of instructions executable by the machine to perform a method for enhancing a desired audio signal for delivery through an electroacoustic channel using a driver. The method includes obtaining a noise estimate based on an external disturbance, generating a dynamic noise compensation (DNC)-conditioned signal by conditioning the desired audio signal as a function of the spectral characteristics of the noise estimate, generating an anti-noise signal using the noise estimate, generating a composite signal from the DNC-conditioned signal and the anti-noise signal, and driving the driver using the composite signal.

Also described herein is a program storage device readable by a machine, embodying a program of instructions executable by the machine to perform a method for enhancing a desired audio signal for delivery through an electroacoustic channel using a driver in the presence of a noise disturbance. The method includes obtaining a first noise estimate based on the external disturbance, obtaining a second noise estimate based on the external disturbance, generating a DNC-conditioned signal by conditioning the desired audio signal as a function of the spectral characteristics of the first noise estimate, generating an anti-noise signal using the first and second noise estimates, generating a composite signal from the DNC-conditioned signal and the anti-noise signal, and driving the driver using the composite signal. The first noise estimate contains an anti-noise component but no DNC-conditioned component.

Thus, in addition to improving the fidelity and/or speech intelligibility of the source signal played out the speaker, the AEQ system as described herein may be used to assist and improve DNC processing. By combining DNC with AEQ (and optionally ANC), an estimate of the ambient environmental noise can be acquired at the entrance to the ear canal. Through novel signal processing techniques described herein, the noise estimate is largely free of any signal contribution from the speaker. This noise estimate is then used to optimize the performance of DNC. In particular, the passive isolation of the headset and the ear will block some of the environmental noise. Thus by sensing this noise at the ear canal entrance, the passive acoustic isolation is taken into account.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings:

FIG. 1 is a block diagram of an audio device, which can be a mobile device such as an MP3 (or other compressed-format audio) player or the like;

DESCRIPTION OF EXAMPLE EMBODIMENTS

Example embodiments are described herein in the context of a method and apparatus for reducing the effect of environmental noise on listeners. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

Figure 1:
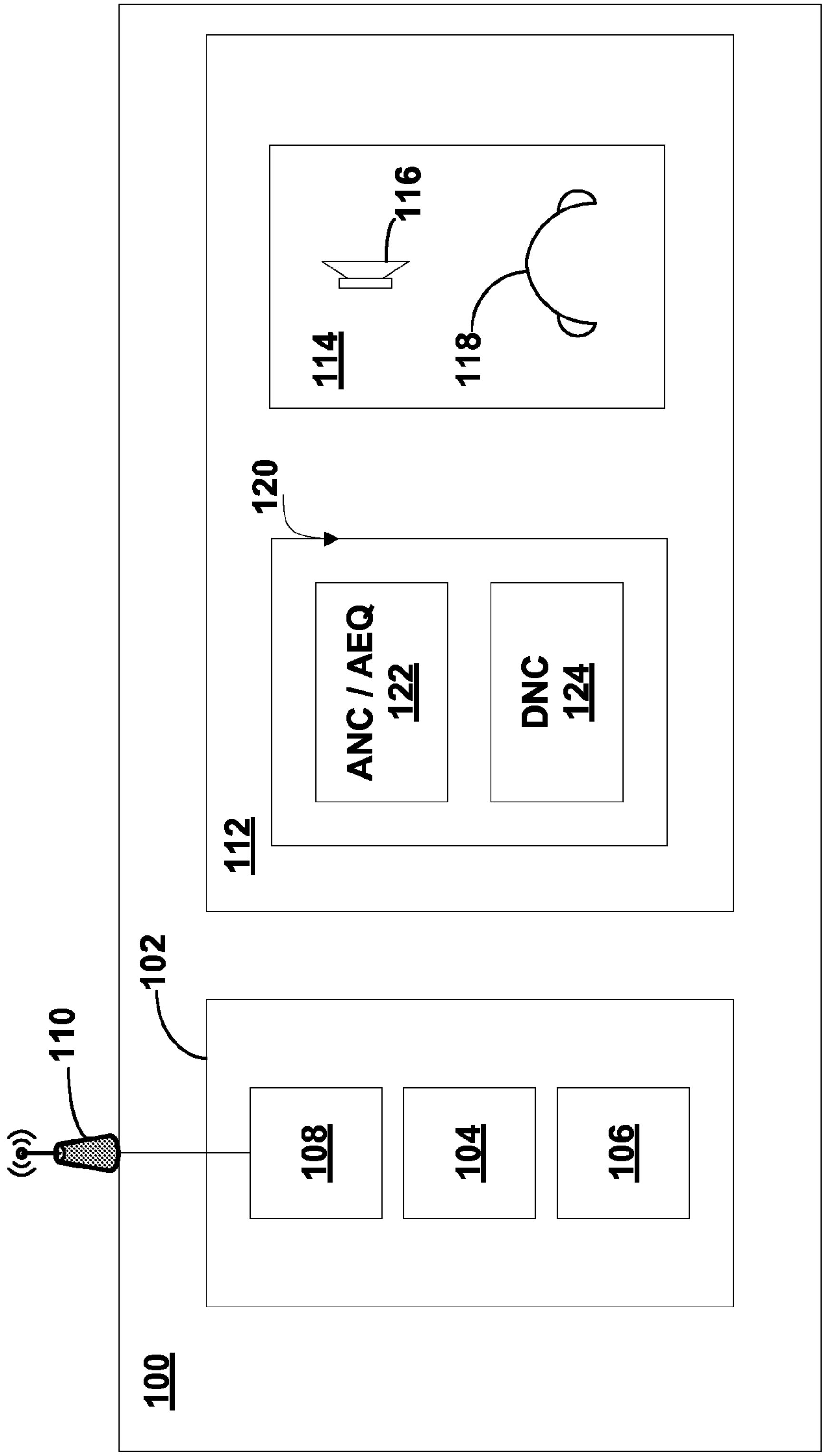

FIG. 1 is a block diagram of an audio device 100, which can be a non-mobile device such as a stereo system or radio or personal computer, or a mobile device such as an MP3 (or other compressed-format audio) player or the like. It can also be a telephone (cellular or otherwise), PDA (personal digital assistant), laptop computer, or the like, or a device configured to provide functionalities of a combination of any of the above devices, for example a PDA or cellular telephone that is configured to store and play back audio in MP3 format.

Audio device 100 includes an audio signal source 102, configured to provide an audio signal that is to be enhanced for improving quality, audibility or intelligibility to a listener. Audio signal source 102 can include a storage device 104, such as an electronic memory, and/or a storage media reading device 106 for reading media, such as an optical or magnetic disk or the like, on which a recording of speech, music, or similar desired audio is stored. Audio signal source 102 can alternatively or in addition include a receiver 108 for receiving the audio signal, by way of RF antenna 110, from an external source, such as a radio station broadcasting prerecorded or live speech, music or the like. Receiver 108 can alternatively or in addition be configured to receive signals representative of speech from another person, in a two-way ("walkie-talkie") type system, or to receive signals from a cellular network in a cellular telephone type application, which may be incorporated in a device such as a PDA (personal digital assistant), or any mobile or non-mobile device configured to receive speech, music or the like.

Audio device 100 includes an enhancement and presentation system 112 having an audio presentation mechanism 114, which can be one or more free standing loudspeakers or drivers 116, or an ear piece (not shown), or a headset 118 incorporating one or more loudspeakers or drivers (not shown) for mono or stereo playback. The term "driver" will primarily be used herein to refer to a loudspeaker or, more generally, any transducer that converts electrical signals to air pressure waves for perception by a listener's ear. Conversely, a transducer that converts air pressure waves to electrical signals will generally be referred to as a microphone. In addition, "audio" or "audio signal" will be used to refer generally to the signal of interest, or desired signal, such as live or pre-recorded music, speech or the like, whereas "noise," "audio noise," "environmental noise" or "ambient noise" will be used to refer generally to the polluting background signal or disturbance from which the desired signal is to be distinguished and over which it is to be enhanced.

Enhancement system 112 also has an enhancement module 120 comprised in part of an active noise cancellation (ANC) module 122 and a dynamic noise compensation (DNC) module 124. As detailed below, active noise cancellation (ANC) module 122 operates to cancel out unwanted ambient noise by introducing "anti-noise" into the electroacoustic channel, and, alternatively or in addition, can apply adaptive equalization (AEQ) to the incoming desired audio signal. The ANC system generates an anti-noise signal, which produces sound pressure waves that are equal in magnitude and opposite in phase (that is, 180 degrees out of phase) to the sound (for example ambient noise) whose influence is to be cancelled out. The physical mechanism that enables noise cancellation in this manner is acoustic destructive interference and is a well-known phenomenon.

Dynamic noise compensation (DNC) module 124 serves to condition the incoming desired audio signal by analyzing the spectral characteristics of the environmental noise and adjusting playback level accordingly. While described here as separate modules, it will be appreciated that such separation of ANC module 122 and DNC module 124 is merely for convenience as overlap of the constituent components of the ANC and DNC modules is contemplated. Further, it will be appreciated that the operation of the modules can be implemented in the analog or digital domains, or in a combination of these two.

Figure 2A:
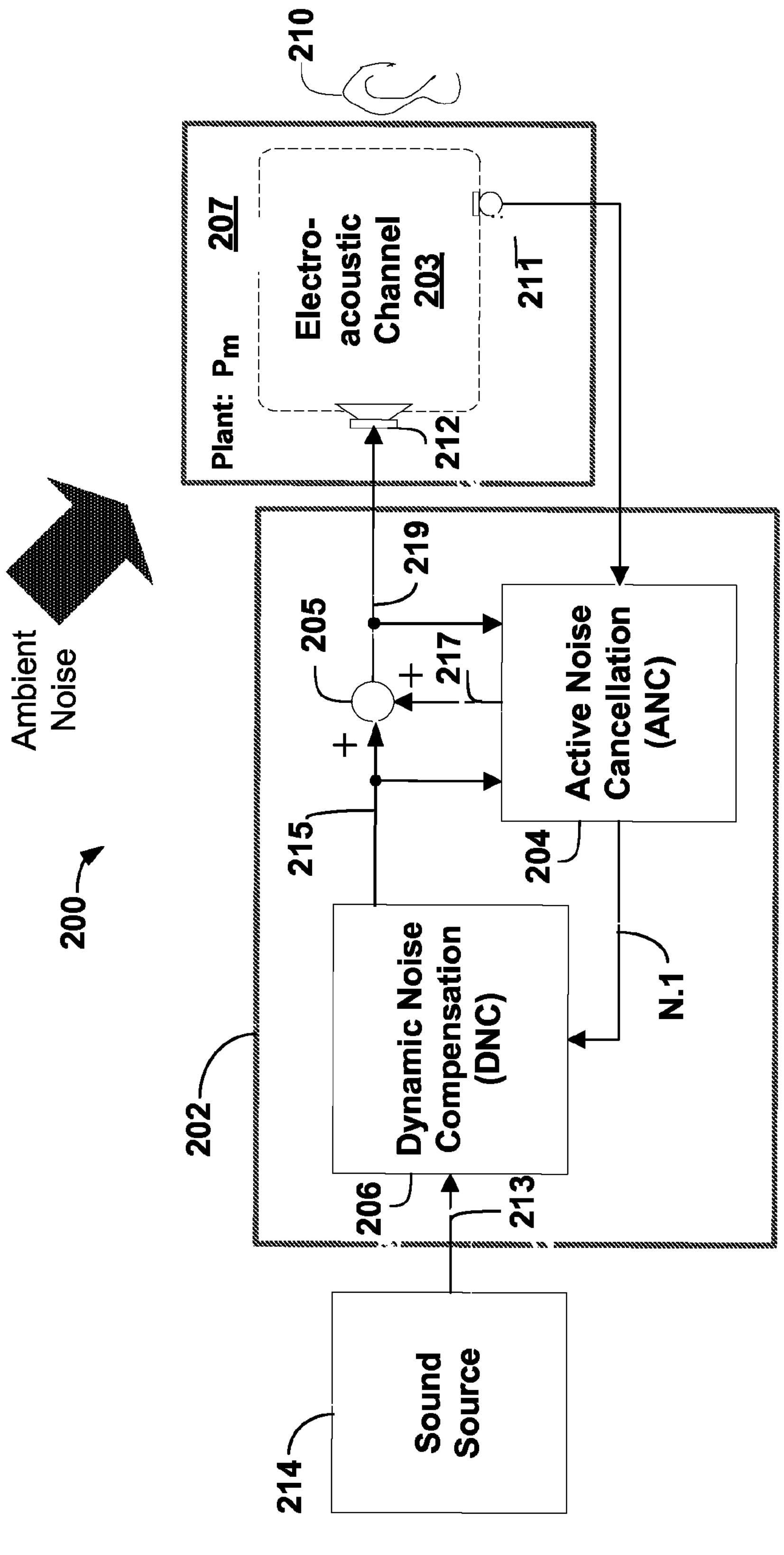
FIG. 2A is a schematic diagram showing and the combination of DNC and ANC.

FIG. 2A is a block diagram of a system 200 for performing enhancement using ANC and DNC. Processing functionality is provided generally by a processor 202, which can be a digital signal processor (DSP) designed to execute signal conditioning algorithms for audio, such as that which is specifically intended to be played back in an electroacoustic channel 203 of a headset, earbud, headphone cup or the like. Processor 202 is shown to include separate ANC (active noise cancellation) and DNC (dynamic noise compensation) modules, designated 204 and 206 respectively, but it is to be understood that these are not necessarily discrete components as much of their circuitry and/or functionality can overlap. A first, source driver 212 provides sound pressure waves to a listener 210 across electroacoustic channel 203. Driver 212 can take the form of one or more speakers (an array), which can be unidirectional or omnidirectional, depending on design choice. The sound pressure waves generated by source driver 212 correspond to the desired audio signal 213, consisting of speech, music, or the like, as derived for example from audio signal source 102 described above, and designated 214 in FIG. 2A. This desired audio signal is conditioned by DNC module 206 and is delivered thereby as DNC-conditioned signal 215. Source driver 212 also delivers an “anti-noise” signal 217 into the electroacoustic channel 203, generated by ANC module 204 as a function of the ambient noise that is detected in the electroacoustic channel by a transducer 211. Thus the signal presented to driver 212 for delivery into the electroacoustic channel 203 is a composite signal 219 consisting of a mixture of the DNC-conditioned desired audio signal 215 as well as the anti-noise signal 217 from ANC module 204. Signals 215 and 217 are additively combined in combiner circuit 205. As also seen from FIG. 2A, ANC module 204 generates an estimate N.1 of the ambient noise, using an input signal from transducer 211. Noise estimate N.1 is passed to DNC module 206 for use thereby. Details of the generation and use of noise estimate N.1 are provided below.

Figure 2B:
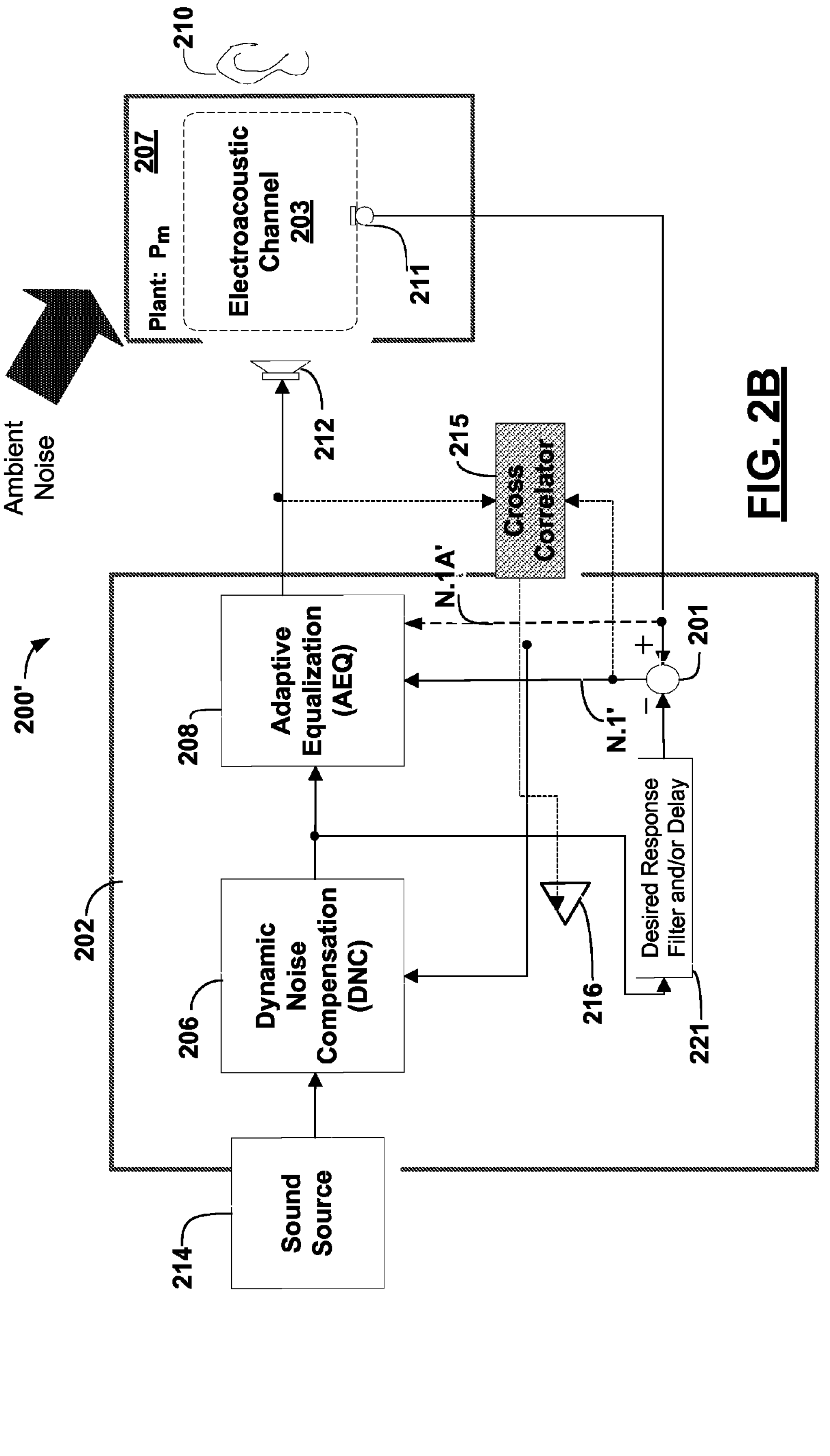
FIG. 2B is a schematic diagram showing the combination of DNC and AEQ.

FIG. 2B is a block diagram of a system 200' which applies adaptive equalization (AEQ) rather than active noise cancellation (ANC). For the system shown in 200', it is beneficial to combine both DNC and AEQ into a single common signal processing block due to the mutual interest in signal N.1', which is an estimate of the environmental noise at the ear canal entrance. Thus in this implementation, AEQ module 208 uses an estimate N.1' of the ambient noise from the environment. The estimate N.1' is computed by subtracting from the microphone signal, a delayed (and optionally filtered) version of the signal issued from DNC module 206. The delay and optional filtering are performed in a desired response filter 221. The signal acquired by microphone 211 is a composite signal consisting of the environmental noise as well as the signal originating from driver 212. Since the output of filter 221 is an estimate of the desired audio signal processed by the electroacoustic channel 207, the subtractive circuit 201 serves to electrically cancel the desired audio signal from the microphone signal, leaving only the estimate N.1' of the ambient noise. This ambient noise estimate N.1' is provided to both AEQ module 208 and DNC module 206, and represents the full power of the ambient noise reaching the microphone 211 in this implementation.

The desired response filter 221 applies a non-flat frequency response that is indirectly applied to the desired audio signal via the application of an adaptive filter (313, FIG. 3D) contained within AEQ block 208. The desired response filter 221 can apply a variety of different equalization tasks, such as limiting the bandwidth of the desired audio signal to a specific frequency range, or applying the free-field response. The subtractive circuit 201 produces a sufficiently accurate estimation of the ambient noise providing the adaptive filter contained within AEQ block 208 has converged (i.e. trends towards a sufficiently similar frequency response) to the ratio of the desired response filter response 221 over the electroacoustic response of 207:

$$C=D/P,$$

Here C is the adaptive filter applied in AEQ block 208. If the desired response filter D is instead just a delay, then the subtractive circuit 201 produces an accurate estimation of the ambient noise providing the adaptive filter has converged to the inverse of the electroacoustic response of 207.

Limits can be imposed on how the modules DNC and AEQ react to the estimate of N.1' for the case where convergence of the adaptive filter coefficients has not been achieved to within a specified tolerance of error, and N.1' is subsequently a sub-optimal estimation of the ambient noise. This is shown through the inclusion of the cross correlator module 215. This module computes a cross-correlation operation, which will be familiar to those skilled in the art of signal processing, to determine the similarity of its two inputs. Thus if the desired audio signal from driver 212 leaks into the noise estimate N.1', the cross correlator will have determined that the AEQ adaptive filter has not converged to its final solution, and the result will be some amount of desired audio signal, leaking into the noise estimate signal N.1'. If the amount of leakage into N.'1 is beyond a threshold, then the cross correlator will send a control signal to an attenuator 216 to limit the degree to which DNC is affected by the noise estimate. This attenuator may also completely shut off the signal N.1' going into the DNC. Alternatively the control signal from cross correlator 215 could be routed directly into the DNC block 206, where the DNC would act appropriately to reduce or modify noise compensation based on this control signal. Limiting the amount of noise compensation due to signal leakage into the noise estimate, affords the ability to prevent any conditions whereby the DNC might exacerbate the amount of desired audio signal leaking into N. 1'. Such a condition could create an unstable feedback loop which could result in a clipped (overly loud) audio signal played through the driver 212. The cross correlator 215 is an optional tool, and is notated as such by the use of dashed lines leading into the module. The signal coming out of the cross correlator 215 is a sub-audio rate (i.e. sampled at a much lower frequency than the audio sample rate) control signal. For the remainder of the diagrams the cross correlator may be assumed to be present but not explicitly shown. The attenuator (216 in FIG. 2B) is shown in the remaining diagrams and represents this correlation-based variable control over the noise estimate feeding the DNC module.

Figure 2C:
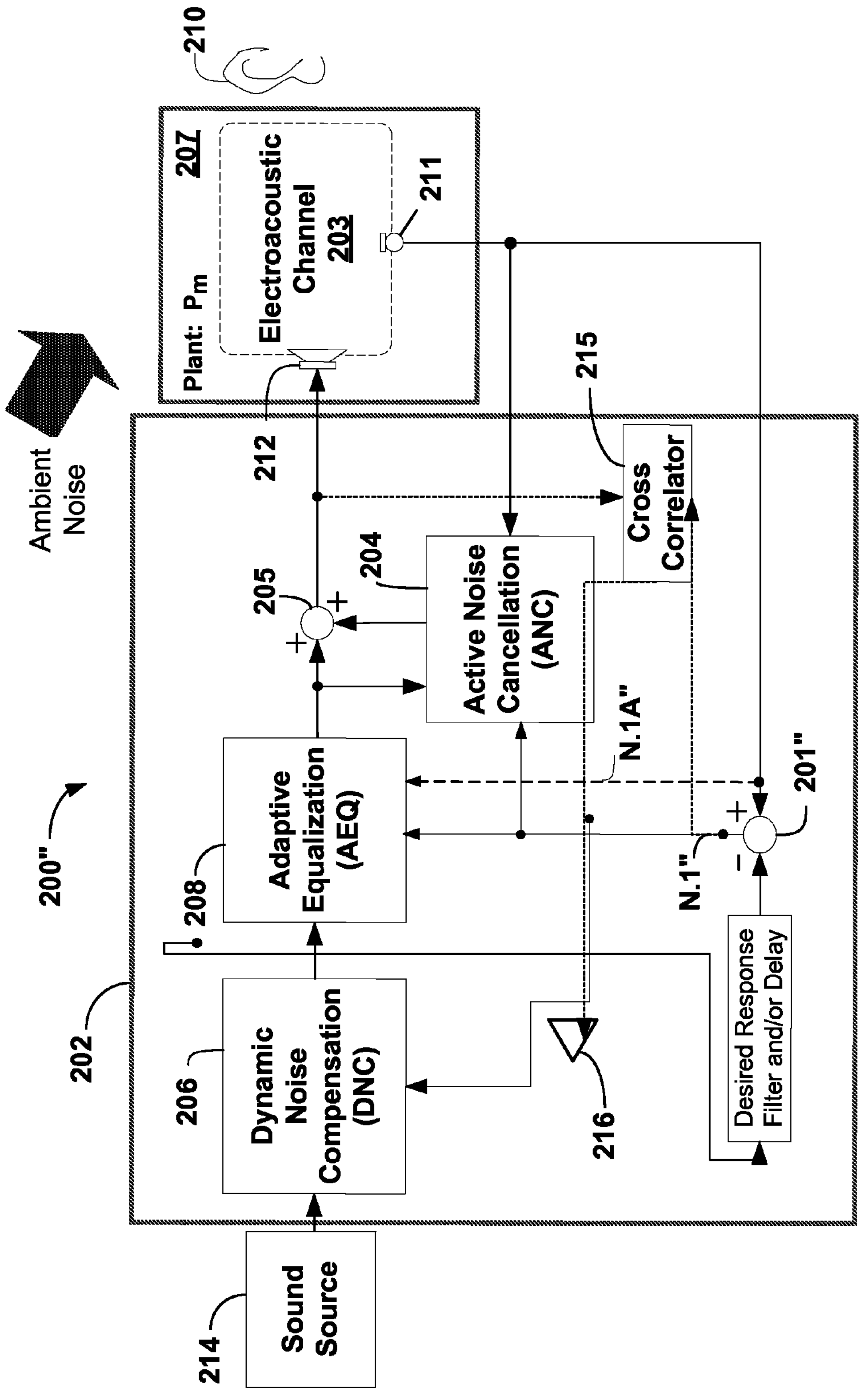
FIG. 2C is a schematic diagram showing the combination of DNC, AEQ, and ANC.

FIG. 2C is a block diagram of a system 200" integrating DNC, AEQ and ANC. All three modules—ANC module 204, DNC module 206 and AEQ module 208—use an estimate N.1" of ambient noise. This estimate N.1" is generated using combiner 201", and in this case represents residual noise in electroacoustic channel 203 after acoustic cancellation by ANC module 204. As in the case of the system 200' in FIG. 2B, sufficient limits are applied as to how the modules DNC, AEQ, and ANC react to N.1" if N.1" contains a sub-optimal estimate of the ambient noise, by way of cross correlator 215 and attenuator 216.

Figure 3A:
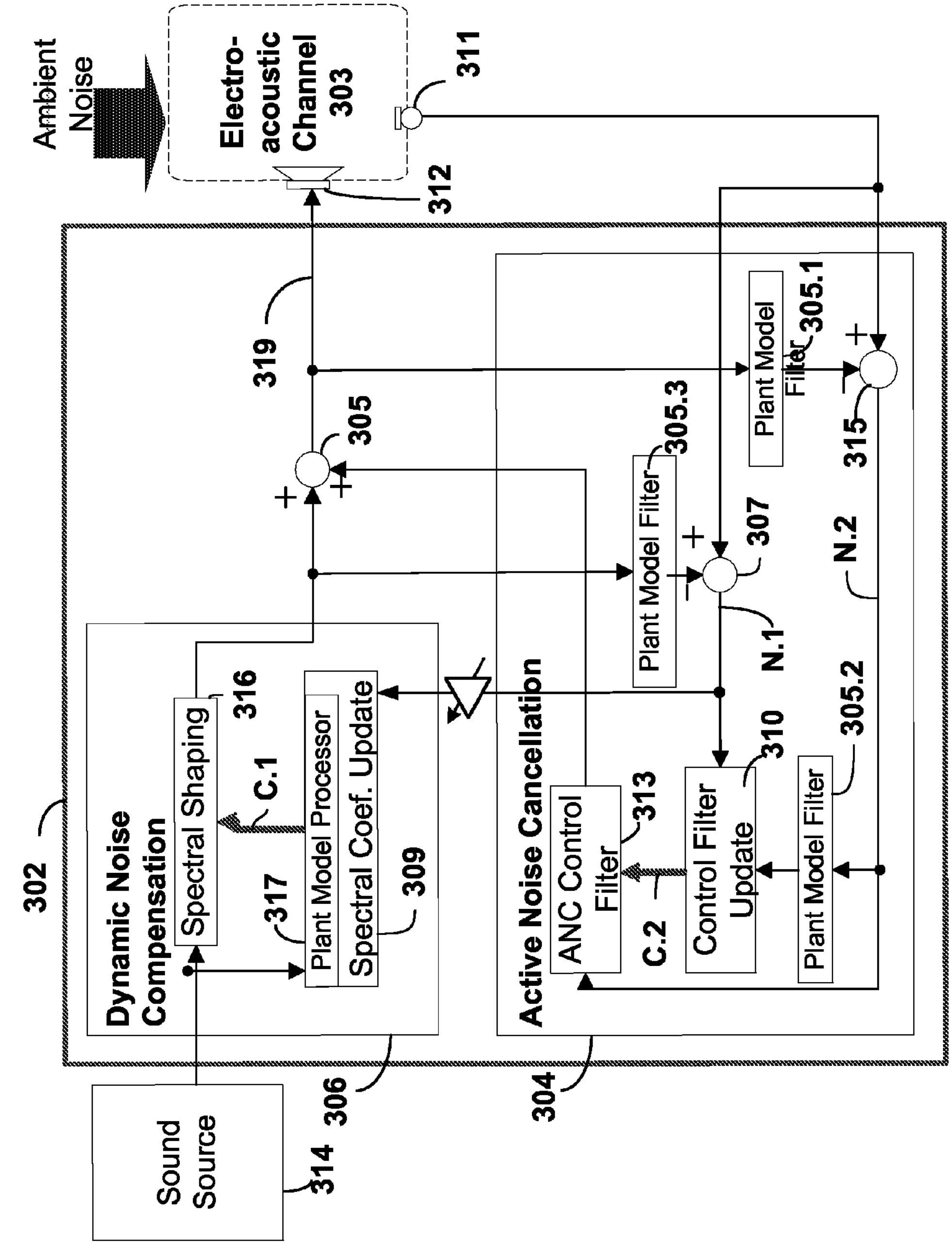
FIG. 3A is a schematic diagram of the Digital Signal Processing Block 202 for FIG. 2A.
Figure 3B:
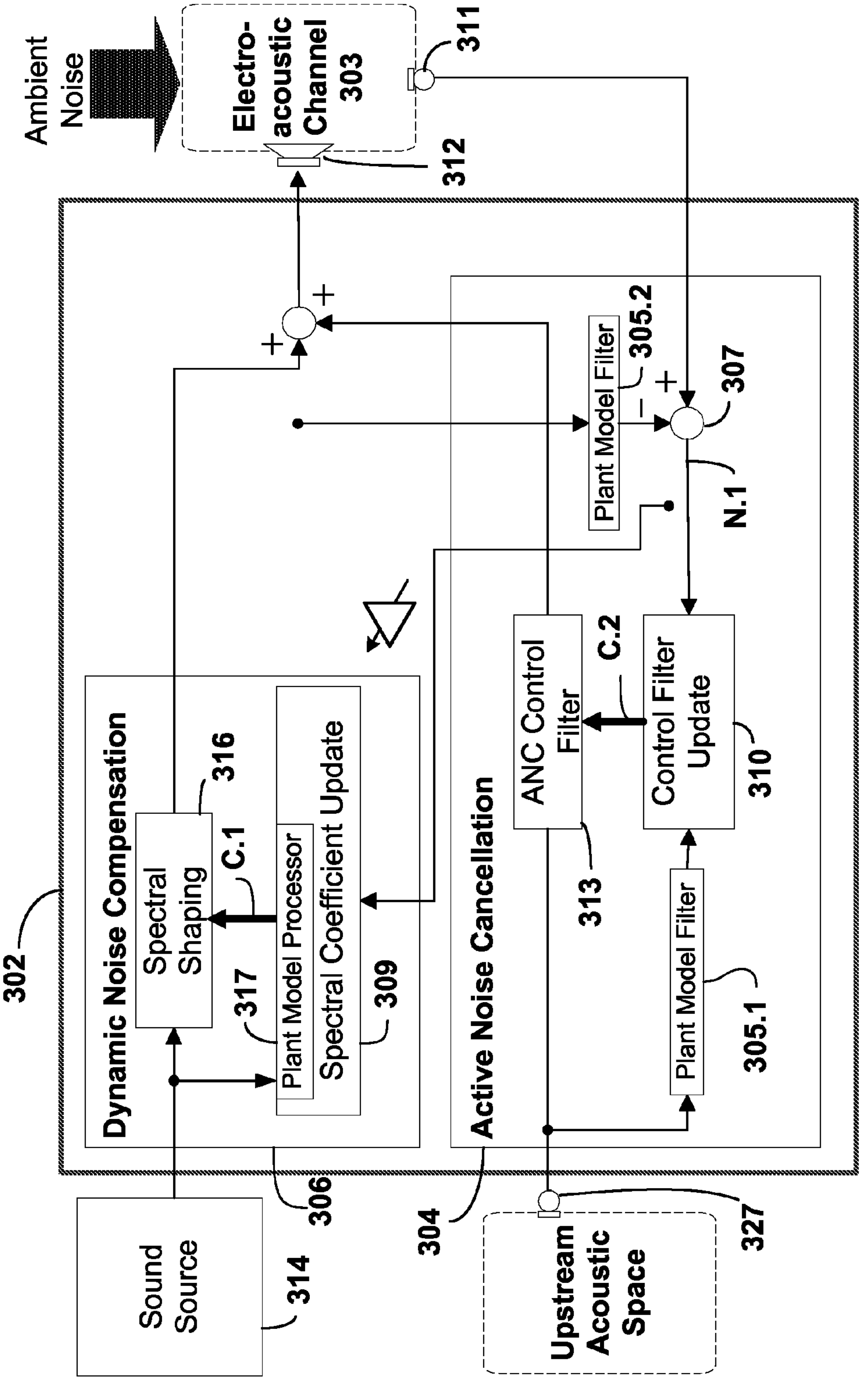
FIG. 3B is a schematic diagram of the Digital Signal Processing Block 202 for FIG. 2A, but showing the feed-forward variant of ANC.

FIGS. 3A and 3B are block diagrams providing additional detail relating to the use of the combination of DNC and ANC as shown in FIG. 2A, with FIG. 3A showing a feedback variant and FIG. 3B showing a feed-forward variant. FIGS. 3A and 3B show principal signal processing blocks 304 (ANC) and 306 (DNC) and the signal flow and principal operations performed by processor 302. Microphone 311 detects both ambient noise and the desired audio signal 319 delivered through driver 312. Audio signal 319 is the composite signal that contains the DNC-conditioned desired audio signal, along with the anti-noise from ANC module 304. Therefore, the signal acquired by the microphone 311 also contains an electro-acoustically filtered form of audio signal 319. Since the ANC block 304 is a feedback-based system, it creates the anti-noise signal from the estimated noise signal N.2. Thus the composite audio signal 319 needs to be removed from the microphone signal that is fed into ANC 304 to form the ambient noise estimate N.2. This is accomplished by subtracting, at combiner 315, an estimate of the composite signal as filtered by an estimate of the electroacoustic channel 303 response, in the form of the filter 305.1. The electroacoustic response 303 is referred to as the plant, and is comprised of the signal conditioning imparted by the electroacoustic elements, which include the driver 312, the characteristics of the electroacoustic channel 303, the microphone 311, and circuits such as electronic amplifiers and analog-to-digital and digital-to-analog converters (not shown). The aggregation of these elements is treated as a signal processing block referred to as the plant model $P_m$. This signal processing block has a particular frequency response, as well as a time-domain equivalent to the frequency response, commonly known as the impulse response. Plant model $P_m$ can be implemented as a filter $F_{Pm}$, instantiated at 305.1, 305.2, 305.3, with a particular delay value, in samples. For implementations with a low sample rate (such as 8 kHz), it may be necessary for the number of delayed samples to be composed of an integer component, as well as a sub-sample fractional component. The plant model filter $F_{Pm}$ can be static, in which case it can be computed offline in the design phase of the product development. This is generally accomplished by measuring the impulse response of the plant P for an adequate number of samplings of the final product hardware units. The resultant plant model filter $F_{Pm}$ can then be taken as the mean of all measured impulse response measurements.

Alternatively, the plant model filter $F_{Pm}$ can be adaptive, in which case it adapts in response to how well the driver 312 is acoustically coupled to the acoustic channel. In the case of a headset application, the adaptation would depend on how well the device acoustically couples to the ear of the listener. In general, an adaptation of plant model filter $F_{Pm}$ will have, as its convergence goal, the minimization of the mean-squared error between the plant model $P_m$, and the actual plant P, at any particular instance in time.

Referring to DNC module 306, one of its functions is to shape the incoming signal from desired sound source 314 in a frequency-dependent manner, using spectral shaping at 316. Spectral shaping can either be applied in the time domain using digital filters, or the frequency domain using block transformations such as, but not limited to, the Discrete Fourier Transform (DFT), or sub-band transformations such as, but not limited to, the Quadrature Mirror Filterbank (QMF). Because the efficacy of the noise cancellation process is greatest for canceling spectrally flat (i.e. noisy) signals below about 1 KHz, and diminishes as frequencies rise above that threshold, it is also beneficial to conduct dynamic noise compensation (DNC) to better condition the audio sound signal to the listening environment. DNC module 306 conducts a spectral analysis of the noise and generates a frequency-based compensation signal that is applied to the incoming audio signal. The operation of DNC module 306 is such that it utilizes the spectral characteristics of the noise, adjusting the playback level of the audio signal in response thereto. Such adjustment can be frequency-band specific gain and/or attenuation control of selective portions of the signal, weighting different frequency components based on the corresponding amount of noise detected and commensurate compensation needed to provide the desired enhancement. In spectral regions where the noise is not distracting, the audio signal can remain largely unmodified. In spectral regions where the background noise level is high enough to negatively affect the perceived quality, intelligibility or audibility of the audio signal, an adjustment is made to the audio signal to improve the audio quality for the listener. The level or aggressiveness of such compensation can be made controllable by the listener through various adjustments that can be provided.

The output of the DNC block 306 is additively combined with the anti-noise signal from ANC 304, at combiner 305, to obtain the composite signal 319 presented to driver 312 for delivery into the electroacoustic channel 303. Spectral shaping coefficients, either in the form of frequency-domain weights or time-domain filter coefficients, are updated by an updating circuit module 309 a set number of times per second in response to stimuli from the environmental noise acquired by microphone 311, and/or in response to the instantaneous spectral response of the sound source 314. The transference of these coefficients is shown at 306 as C.1. Spectral coefficient update module 309 can include a plant model processor 317, which serves to take into account the effect of the plant, or plant response $P_m$, on the desired audio. Plant model processor 317 can for instance limit or expand the amount of frequency-dependent modification applied to the desired audio signal in spectral shaping module 316 as a function of the effect of the plant model $P_m$ on the desired audio, or it can apply equalization by applying the spectral inverse of the plant model $P_m$. This inverse equalization can be applied in either the presence or absence of a dedicated adaptive equalization (AEQ) module. Alternatively, plant model processor 317 can apply coarse-grained adaptive equalization, such as switching among a set of given filters, while an AEQ module (not shown) applies higher-resolution, and/or more time-responsive adaptive equalization. These operations occur in either the frequency domain or the time domain, depending on which domain is employed in spectral coefficient update block 309. This implies that any adaptation of the filter based on the plant model $P_m$ for the purpose of computing the filters 305.1, 305.2 and 305.3 could also be used to adapt the parameters of the plant model processor 317, as shown below. Plant model processor 317 and plant model filters 305.1, 305.2 and 305.3 are thus related to one another and can share some common resources and characteristics, and can for example be updated and/or adapted as a function of each other. Alternatively the plant model filters can be all equal in terms of filter topology and coefficient values. The reuse by plant model processor 317 of resources related to the adaptation, or otherwise real-time servicing of the plant model filters 305.1, 305.2 and 305.3 is a novel reuse of resources from the ANC module 304.

Returning to active noise cancellation (ANC) module 304, it uses a control filter 313 whose coefficients are updated by a control filter update module 310 and transferred thereto at C.2. The updates can be computed using adaptive filtering techniques, such as the Least Mean Squared (LMS), or variants on this algorithm, in a known manner. Modules 310 and 313, which may be collectively referred to as the adaptive filter, can also be partly or wholly implemented in the frequency domain using block transformations such as, but not limited to, the Discrete Fourier Transform (DFT), or subband transformations such as, but not limited to, the Quadrature Mirror Filterbank (QMF). If the adaptive filter is not an LMS adaptive filter, or LMS-variant adaptive filter, the inclusion of a plant model filter $F_{Pm}$ 305.2 may not be necessary. As an example, a frequency-domain adaptive filter does not necessarily rely on the inclusion of the plant model filter. The goal is for the adaptive filter to converge towards an optimal filter that is the negative of the inverse of the plant P. In particular, the adaptive filter will converge, over time, towards:

$$C=-1/P,$$

where C is the control filter applied in 313 and P is the plant response. An advantage provided by the described arrangement accrues from the use of the plant model $P_m$ to perform signal conditioning that is amenable to both ANC and DNC. In particular, the use of the plant model $P_m$ coefficients to condition the signal from the microphone 311 for the benefit of both ANC and DNC realizes processing economy and efficiency.

FIG. 3A also shows two additional filters, 305.2 and 305.3, which are either exact copies (in terms of filter coefficients and filter implementation) of the digital filter implemented in 305.1, or variations that provide an approximation of the frequency response of the digital filter implemented in 305.1. The filters 305.2 and 305.1 are implementations of known Internal Model Control algorithms and no further explanation thereof is necessary. As explained above, filter 305.1 is used in the generation of noise estimate N.2. Filter 305.3 is used in the generation of noise estimate N.1, obtained by subtractively combining, at 307, the output of DNC 306 with the output of microphone 311.

A notable difference between noise estimates N.1 and N.2 is that N.1 is an estimate of the ambient noise after noise cancellation (that is, inclusive of noise cancellation), whereas N.2 is an estimate of the ambient noise before noise cancellation (that is, exclusive of noise cancellation), as described below. The efficacy of the noise estimates is a function of the error difference between the plant P and the plant model $P_m$. In particular, if $P=P_m$, then the noise estimates are exact, in which case N.1 and N.2 are devoid of the desired audio signal and consist exclusively of noise. In computing the estimates N.1 and N.2, the contribution of the driver 312 signal is removed from the microphone 311 signal. But since signals played through the plant P have been affected by the response of the plant, an estimation of the composite signal presented to the driver 312 and conditioned by the plant estimate $P_m$, is required. Thus, considering N.2, applying the plant model filter 305.1 to the composite signal (which includes the DNC-conditioned desired audio signal, as well as the anti-noise signal), and subtracting this signal from the microphone signal at 315, effectively removes the composite signal from the microphone 311 signal, leaving N.2, which represents the ambient noise estimate before cancellation. This means that the anti-noise acoustic cancellation that was applied in 303 is effectively "undone." With regard to N.1, by comparison, the signal subtracted at 307 is not the composite signal since it only contains the DNC-conditioned desired audio signal issued from DNC 306. Thus the anti-noise signal applied in the electroacoustic channel remains in noise estimate N.1, and only the DNC-conditioned desired audio signal is removed from the microphone signal at combiner 307. In this way N.1 is the ambient noise after noise cancellation. Another way to think of noise estimate N.1 is as the residual noise energy remaining after anti-phase cancellation. Control filter update 310 uses this residual noise estimation N.1 to drive the adaptive filter convergence towards the negative inverse of the plant.

As seen from FIG. 3A, the noise estimate signal N.1 is reused to optimize the spectral coefficient update 309 in DNC. Advantageously, this allows DNC module 306 to analyze the remaining environmental noise and adjust the spectral coefficients in 309 in light of the noise cancellation already applied by ANC block 304. Furthermore, since N.1 is already present in the system, as it is utilized to update the ANC control filter coefficients at 310, the computation of N.1 as a signal to benefit DNC is achieved efficiently without any imposed additional computational burden. Furthermore, DNC benefits from acquiring the environmental noise estimate from microphone transducer 311 rather than another microphone placed on the external casing of the device.

Figure 4:
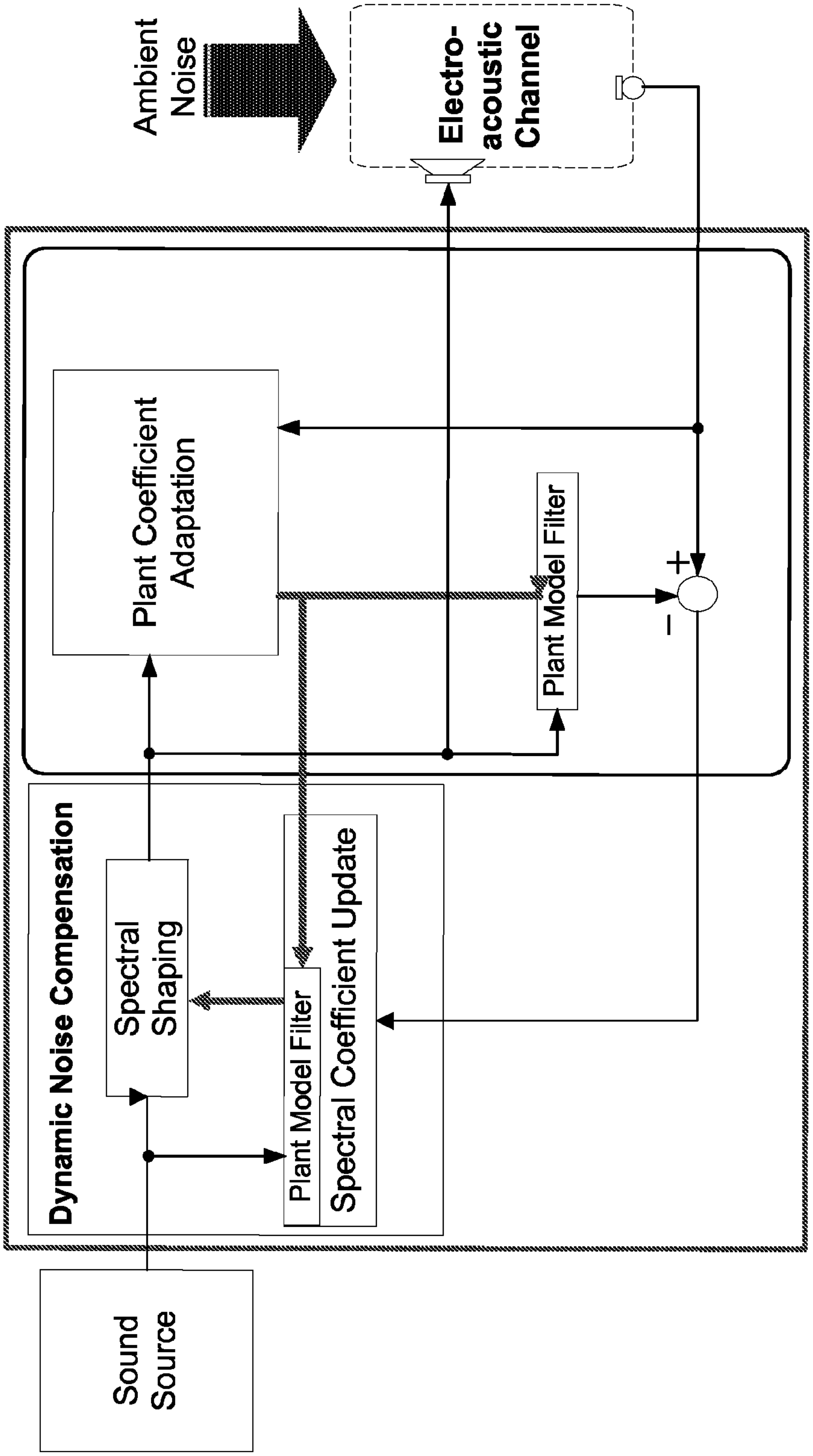
FIG. 4 is a schematic diagram of DNC showing those modules that would be deemed redundant if DNC were to be combined with either ANC or AEQ.

Another advantage inures from the transference of plant model information to the spectral coefficient update block 309 for modification of the desired audio signal by the plant model processor sub-block 317. If the plant model filter $F_{Pm}$ is at all time-varying due to adaptation, then the computation of the adaptive plant model filter—either as a copy of the adaptive plant model filter 305.1, or a simplification of this plant model filter, or a parameterization of this plant model filter—then the adaptive plant model filter $F_{Pm}$ can be computed once for all three modules—the DNC module, the ANC module and the AEQ module. To illustrate this, reference is made to FIG. 4, wherein the module shown in the cross-hatched area does not need to be explicitly computed for DNC, if DNC is used in conjunction with either ANC or AEQ.

FIG. 3B is a feed-forward implementation using a combination of ANC with DNC. In this case, an indication of the ambient noise in the environment is acquired using a second, dedicated transducer or microphone 327 that is physically located such that the acquired signal is independent of the first transducer 311. Accordingly, it is not necessary to compute an estimate of the environmental noise before noise cancellation since this signal is provided by the external transducer 327. The ambient noise estimate after noise cancellation is still computed as it was computed in the feedback case, and is shown as signal N.1.

Figure 3C:
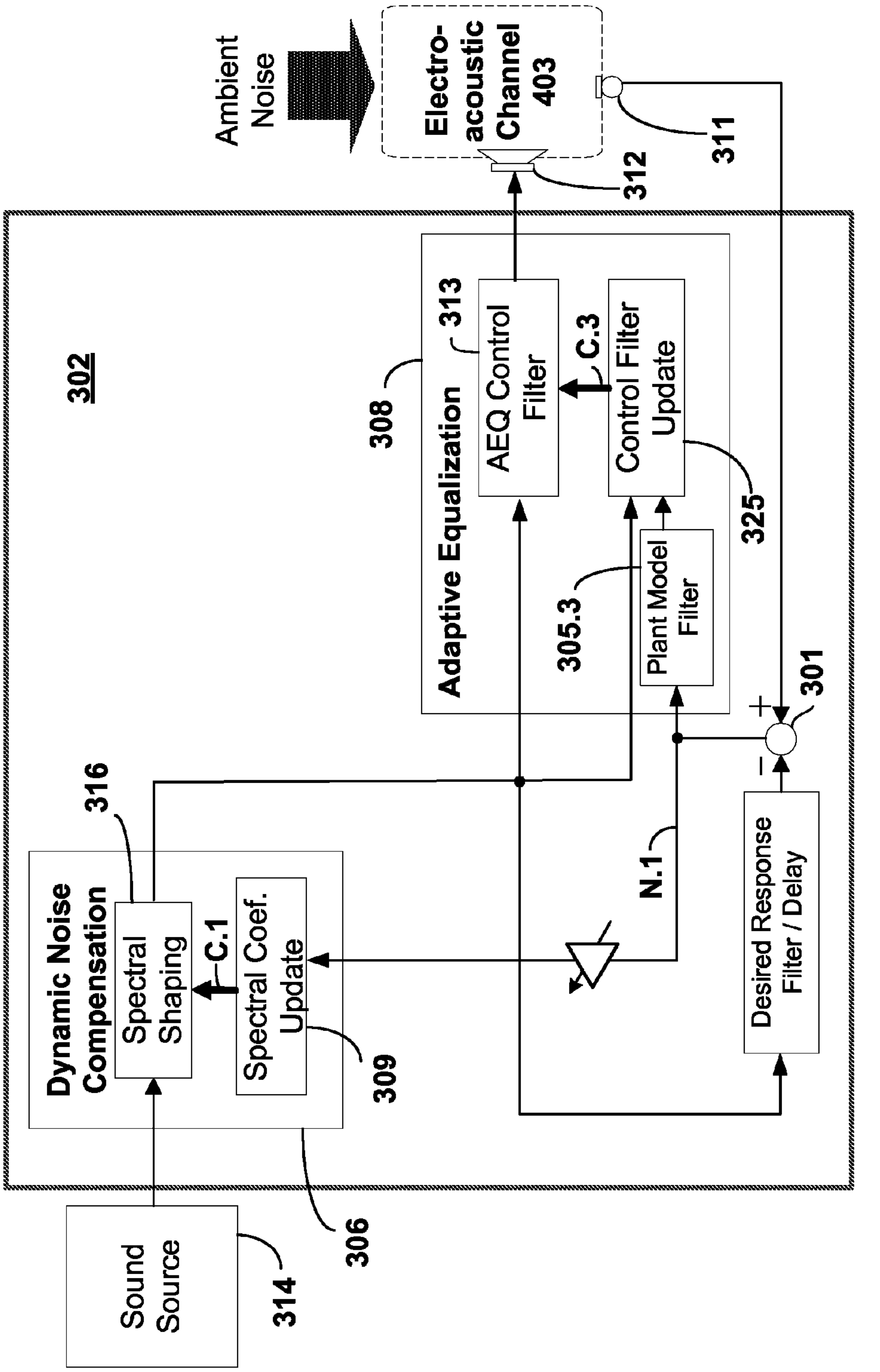
FIG. 3C is a schematic diagram of the Digital Signal Processing Block 202 for 2B.

FIG. 3C is a more detailed diagram of the DNC/AEQ combination implementation of FIG. 2B, with adaptive equalization module AEQ designated 308. It includes an AEQ control filter 313 for filtering the signal from DNC 306. The AEQ control filter 313 is updated at C.3 using a control filter update block 325, whose input is the signal from DNC 306 filtered using plant model filter 305.3. The output of AEQ 308 is used to drive driver 312. Both the control filter update block 325 and the spectral coefficient update 309 also receive as an input a noise estimate N.1, from combiner 301, which operates to subtract from microphone 311, a delayed and filtered output of DNC 306.

Figure 3D:
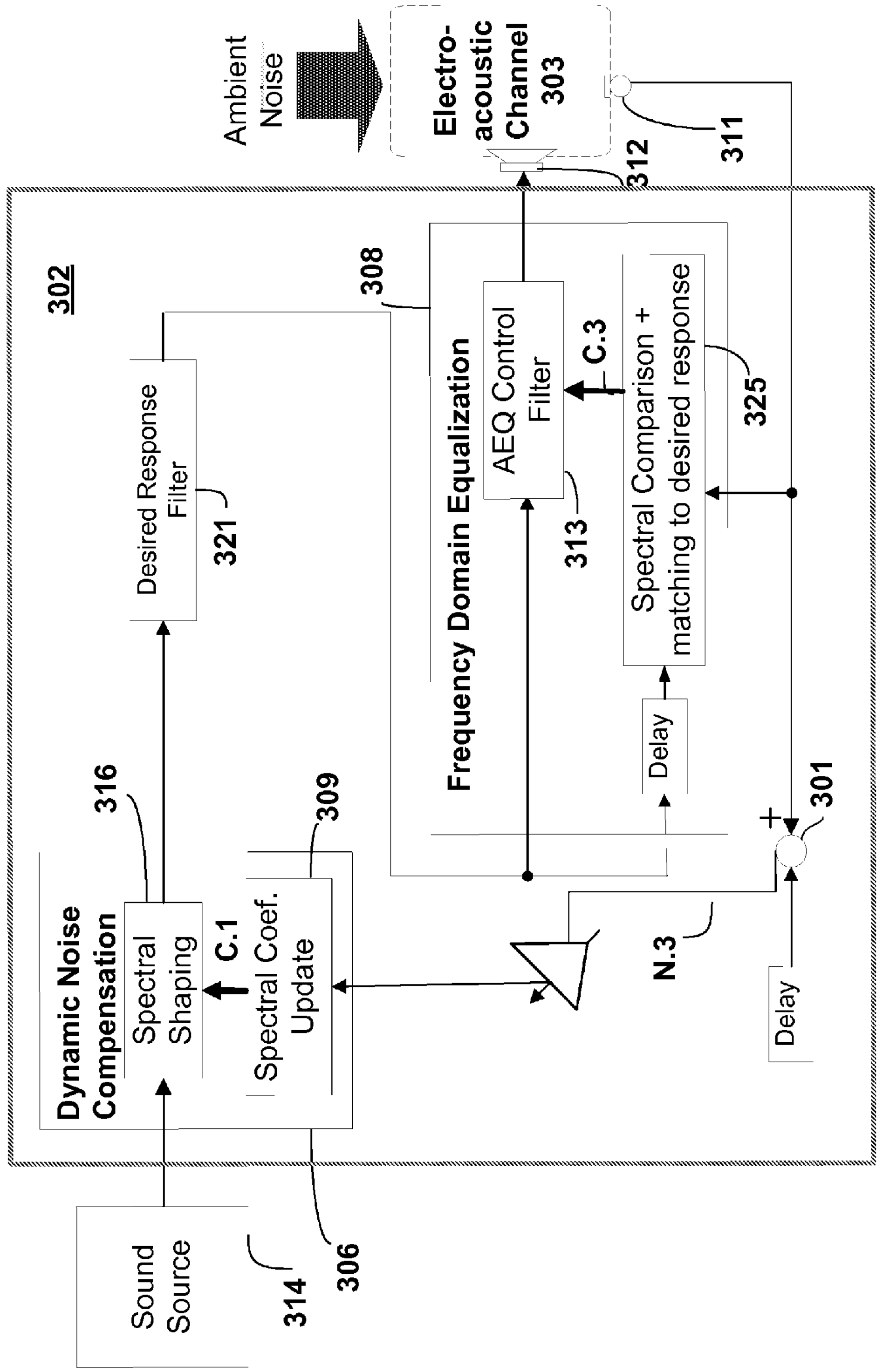
FIG. 3D is a schematic diagram of the Digital Signal Processing Block 202 for 2B for the case of a frequency-domain equalizer.

FIG. 3D shows the same combination of DNC with AEQ as FIG. 3C, but in this case the AEQ is implemented as a frequency-domain processor, in which either or both modules 325 and 313 are implemented in the frequency domain. Frequency-domain processing, in this context, implies either block transformations such as, but not limited to, the Discrete Fourier Transform (DFT), or subband transformations such as, but not limited to, the Quadrature Mirror Filterbank (QMF). Note that the AEQ system in this manner does not require a plant model filter $P_m$ since this AEQ system does not benefit from having an estimate of the environmental noise in isolation from the driver signal 312. The principal advantage then of including both DNC and AEQ in a unified signal processor 302 is that the combiner 301 is able to form the environmental noise estimate by computing the difference between the microphone signal and a delayed copy of the input to the frequency-domain equalizer 308. The delay in this case is to compensate for the electroacoustic delay through the plant P, as well as the delay through the equalizer 308 so that the inputs to the combiner 301 will be in time synchrony. Thus even though the AEQ and DNC modules do not tap into a signal (or signals) of mutual interest such as N.1 in FIG. 3.C, the inclusion of an AEQ module still benefits DNC since equalizing the electro-electroacoustic channel allows the environmental noise estimate to be computed via the simple combiner 301.

The use of both ANC and DNC to enhance the listening experience overcomes limitations that are specific to each of these schemes when applied singularly. As explained above, ANC is generally most effective at frequencies that are less than about 1 KHz for the case of canceling broadband (i.e. pink) noise-type signals. For frequencies above that threshold, DNC can modify the desired audio signal and further enhance the quality of playback. In addition, since ANC and DNC share some common measurements, computations and models, considerable savings in resources and improvements in efficiency can be realized by reusing these shared features rather than developing them separately for ANC and DNC.

In particular, since noise cancellation (ANC) competently attenuates noise at lower frequencies, DNC can apply less noise compensation for those lower frequencies, resulting in a reduction in modification of the desired audio signal for lower frequencies. In addition, the placement of error-sensing microphone in the acoustic path ensures that DNC can sense the environmental noise after cancellation. As described above, the ANC process utilizes a plant model of the frequency response and delay in its calculations. This model also benefits the DNC process by facilitating an estimate of the loudness and frequency response of the desired audio signal at the ear or listener location, rather than assuming ideally flat-response electroacoustic elements. In this manner, noise cancellation and equalization can be reactive to both environmental noise after cancellation and the real-time plant response applied to the speech/audio signal.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

An embodiment of the present invention may relate to one or more of the example embodiments, enumerated below ("EEE").

EEE 1. A method for enhancing a desired audio signal for delivery through an electroacoustic channel, comprising: obtaining a noise estimate attributable to an external disturbance; applying the noise estimate to a dynamic noise compensation (DNC) process to thereby condition the desired audio signal as a function of the spectral characteristics of the noise estimate; and applying the noise estimate to an adaptive equalization (AEQ) process to thereby condition the desired audio signal as a function of the electroacoustic response of the electroacoustic channel.

EEE 2. The method of EEE 1, wherein the noise estimate is generated by: subtracting, from a sensed electroacoustic channel sound level signal, a filtered and/or delayed output of the DNC process.

EEE 3. The method of EEE 2, wherein the filtered and/or delayed output is filtered by a desired response filter.

EEE 4. The method of EEE 3, wherein the desired response filter has a non-flat frequency response.

EEE 5. The method of EEE 4, further comprising applying an output of the DNC process to an adaptive equalization filter of the AEQ process.

EEE 6. The method of EEE 5, further comprising selectively limiting the level of the noise estimate applied to the DNC process.

EEE 7. The method of EEE 6, wherein the selective limiting is a function of a convergence of the characteristics of the adaptive equalization filter towards a ratio of the desired response filter to a model of the electroacoustic channel.

EEE 8. The method of EEE 7, wherein convergence is determined by cross correlating the noise estimate with an output of the AEQ process.

EEE 9. The method of EEE 8, wherein the selective limiting is achieved using an attenuator applied to the noise estimate, the attenuator operating as a function of the cross correlation.

EEE 10. The method of EEE 1, wherein the DNC process is implemented in the time domain.

EEE 11. The method of EEE 1, wherein the DNC process is implemented in the frequency domain.

EEE 12. The method of EEE 1, wherein the AEQ process is implemented in the time domain.

EEE 13. The method of EEE 1, wherein the AEQ process is implemented in the frequency domain.

EEE 14. A method for enhancing a desired audio signal for delivery through an electroacoustic channel, comprising: obtaining a noise estimate attributable to an external disturbance; applying the noise estimate to a dynamic noise compensation (DNC) process to thereby condition the desired audio signal as a function of the spectral characteristics of the noise estimate; applying the noise estimate to an adaptive equalization (AEQ) process to thereby condition the desired audio signal as a function of the electroacoustic response of the electroacoustic channel; and applying the noise estimate to an active noise cancellation (ANC) process configured to generate anti-noise for delivery into the electroacoustic channel.

EEE 15. The method of EEE 14, wherein the noise estimate is generated by: subtracting, from a sensed electroacoustic channel sound signal, a filtered and/or delayed output of the DNC process.

EEE 16. The method of EEE 15, wherein the sensed electroacoustic channel sound level signal represents sound level in the acoustic channel after delivery of anti-noise.

EEE 17. The method of EEE 16, wherein the filtered and/or delayed output is filtered by a desired response filter.

EEE 18. The method of EEE 17, wherein the desired response filter has a non-flat frequency response.

EEE 19. The method of EEE 18, further comprising applying an output of the DNC process to an adaptive equalization filter of the AEQ process.

EEE 20. The method of EEE 19, further comprising selectively limiting the level of the noise estimate applied to the DNC process.

EEE 21. The method of EEE 20, wherein the selective limiting is a function of a convergence of the characteristics of the adaptive equalization filter towards a ratio of the desired response filter to a model of the electroacoustic channel.

EEE 22. The method of EEE 21, wherein convergence is determined by cross correlating the noise estimate with an output of the AEQ process.

EEE 23. The method of EEE 22, wherein the selective limiting is achieved using an attenuator applied to the noise estimate, the attenuator operating as a function of the cross correlation.

EEE 24. The method of EEE 14, wherein the DNC process is implemented in the time domain.

EEE 25. The method of EEE 14, wherein the DNC process is implemented in the frequency domain.

EEE 26. The method of EEE 14, wherein the AEQ process is implemented in the time domain.

EEE 27. The method of EEE 14, wherein the AEQ process is implemented in the frequency domain.

EEE 28. A method for enhancing a desired audio signal for delivery through an electroacoustic channel using a driver, the method comprising: obtaining a noise estimate based on an external disturbance; generating a dynamic noise compensation (DNC)-conditioned signal by conditioning the desired audio signal as a function of the spectral characteristics of the noise estimate; generating an anti-noise signal using the noise estimate; generating a composite signal from the DNC-conditioned signal and the anti-noise signal; and driving the driver using the composite signal.

EEE 29. The method of EEE 28, wherein the active noise cancellation process is a feedback-based process in which the noise estimate is derived by subtracting, from a sensed electroacoustic channel sound level signal, an estimate of the composite signal.

EEE 30. The method of EEE 29, wherein the estimate of the composite signal is generated by applying a plant model filter to the composite signal.

EEE 31. The method of EEE 30, wherein the plant model filter is static.

EEE 32. The method of EEE 30, wherein the plant model filter is adaptive.

EEE 33. The method of EEE 31, wherein conditioning the desired audio signal as a function of the spectral characteristics of the noise estimate comprises applying frequency-band specific gain and/or attenuation control of selective portions of the audio signal.

EEE 34. The method of EEE 33, further comprises providing selectiveness of a level of aggressiveness of the application of the frequency-band specific gain and/or attenuation control of selective portions of the audio signal.

EEE 35. The method of EEE 28, wherein conditioning the desired audio signal as a function of the spectral characteristics of the noise estimate comprises applying spectral shaping coefficients to the desired audio signal and updating the spectral shaping coefficients as a function of the noise estimate and/or the spectral response of the desired sound source.

EEE 36. The method of EEE 35, wherein the spectral coefficients are updated as a function of a plant model.

EEE 37. The method of EEE 36, further comprising limiting an amount of frequency-dependent modification applied to the desired audio signal via spectral shaping as a function of the plant model.

EEE 38. The method of EEE 36, further comprising applying adaptive equalization as a function of the plant model.

EEE 39. The method of EEE 28, wherein the estimate of the composite signal is generated by applying a plant model filter to the composite signal, and wherein conditioning the desired audio signal as a function of the spectral characteristics of the noise estimate comprises applying spectral shaping coefficients to the desired audio signal and updating the spectral shaping coefficients as a function of the noise estimate and/or the spectral response of the desired sound source, the spectral coefficients being updated as a function of a plant model sharing characteristics of the plant model filter.

EEE 40. The method of EEE 39, wherein the plant model and plant model filter are updated in relation to one another.

EEE 41. The method of EEE 28, wherein generating an anti-noise signal using the noise estimate comprises using a control filter having coefficients that are updatable in an adaptive filtering process.

EEE 42. The method of EEE 41, wherein the adaptive filtering process comprises a least mean squared (LMS) algorithm.

EEE 43. The method of EEE 28, wherein the DNC process is implemented in the time domain.

EEE 44. The method of EEE 28, wherein the DNC process is implemented in the frequency domain.

EEE 45. A method for enhancing a desired audio signal for delivery through an electroacoustic channel using a driver in the presence of a noise disturbance, the method comprising: obtaining a first noise estimate based on the external disturbance; obtaining a second noise estimate based on the external disturbance; generating a DNC-conditioned signal by conditioning the desired audio signal as a function of the spectral characteristics of the first noise estimate; generating an anti-noise signal using the first and second noise estimates; generating a composite signal from the DNC-conditioned signal and the anti-noise signal; and driving the driver using the composite signal, wherein the first noise estimate contains an anti-noise component but no DNC-conditioned component.

EEE 46. The method of EEE 45, wherein generating the anti-noise is conducted in a feed-forward based process in which the second noise estimate is derived from a dedicated transducer.

EEE 47. The method of EEE 45, wherein generating anti-noise is conducted in a feed-back process in which the second noise estimate is derived by subtracting, from a sensed electroacoustic channel sound level signal, an estimate of the composite signal.

EEE 48. The method of claim 47, wherein the estimate of the composite signal is generated by applying a plant model filter to the composite signal.

EEE 49. The method of EEE 48, wherein the plant model filter is static.

EEE 50. The method of EEE 48, wherein the plant model filter is adaptive.

EEE 51. The method of EEE 45, further comprising selectively limiting the level of the second noise estimate applied to the DNC process.

EEE 52. The method of EEE 51, wherein the selective limiting is achieved using an attenuator applied to the noise estimate, the attenuator operating as a function of a cross correlation operation.

EEE 53. The method of EEE 45, wherein the DNC process is implemented in the time domain.

EEE 54. The method of EEE 45, wherein the DNC process is implemented in the frequency domain.

EEE 55. An audio enhancement system for enhancing a desired audio signal, comprising: a dynamic noise compensation (DNC) module configured to generate a DNC-conditioned signal, the DNC module including a spectral shaping filter operable to apply spectral shaping to the desired audio signal based on spectral characteristics of a first noise estimate; and an adaptive equalization (AEQ) module configured to generate an AEQ-conditioned signal, the AEQ module including an adaptive equalization control filter operable to receive the DNC-conditioned signal and apply thereto adaptive equalization as a function of the first noise estimate.

EEE 56. The system of EEE 55, further including a combiner operable to generate the first noise estimate by subtractively combining a delayed and/or filtered version of the DNC-conditioned signal with sensed electroacoustic channel sound signal.

EEE 57. The system of EEE 56, further comprising: a cross correlator operable to selectively limit a level of the first noise estimate based on a convergence operation of the adaptive equalization control filter; and a desired response filter configured to receive the DNC-conditioned signal, the convergence operation being a convergence of the characteristics of the adaptive equalization control filter towards a ratio of the desired response filter to a model of the electroacoustic channel.

EEE 58. The system of EEE 57, further comprising an attenuator configured to receive an output of the cross correlator and operable to selectively limit the level of the first noise estimate.

EEE 59. The system of EEE 57, wherein the desired response filter has a non-flat frequency response.

EEE 60. The system of EEE 55, wherein the AEQ-conditioned signal is operable to drive a driver in an electroacoustic channel.

EEE 61. The system of EEE 55, wherein the adaptive equalization filter is updatable using a first update signal that is a function of an electroacoustic response of an electroacoustic channel.

EEE 62. The system of EEE 61, further comprising a plant model filter having characteristics of the electroacoustic channel, wherein the adaptive equalization filter is further updatable using a second update signal obtained from the plant model filter.

EEE 63. The system of EEE 55, further including: an active noise cancellation module configured to generate an anti-noise signal based on the first noise estimate; and a combiner operable to combine the anti-noise signal with the AEQ-conditioned signal.

EEE 64. The system of EEE 63, further comprising: a cross correlator operable to selectively limit a level of the first noise estimate based on a convergence operation of the adaptive equalization control filter; and a desired response filter configured to receive the DNC-conditioned signal, the convergence operation being a convergence of the characteristics of the adaptive equalization control filter towards a ratio of the desired response filter to a model of the electroacoustic channel.

EEE 65. The system of EEE 64, further comprising an attenuator configured to receive an output of the cross correlator and operable to selectively limit the level of the first noise estimate.

EEE 66. The system of EEE 64, wherein the desired response filter has a non-flat frequency response.

EEE 67. The system of EEE 55, further comprising a driver configured to receive the AEQ-conditioned signal.

EEE 68. The system of EEE 55, wherein the DNC module is operative in the time domain.

EEE 69. The system of EEE 55, wherein the DNC module is operative in the frequency domain.

EEE 70. The system of EEE 55, wherein the AEQ module is operative in the time domain.

EEE 71. The system of EEE 55, wherein the AEQ module is operative in the frequency domain.

EEE 72. An audio enhancement system for enhancing a desired audio signal for delivery through an electroacoustic channel, comprising: a dynamic noise compensation (DNC) module configured to generate a DNC-conditioned signal, the DNC module including a spectral shaping filter operable to apply spectral shaping to the desired audio signal based on spectral characteristics of a first noise estimate; an active noise cancellation (ANC) module including a control filter having filter characteristics updatable by the first noise estimate and having a first input for receiving a second noise estimate and generating therefrom an anti-noise signal; and a first combiner for combining the DNC-conditioned signal and the anti-noise signal to generate a composite signal.

EEE 73. The system of EEE 72, further comprising a second combiner operable to subtract the DNC-conditioned signal from a sensed electroacoustic channel signal to thereby generate the first noise estimate.

EEE 74. The system of EEE 73, further comprising a third combiner for subtracting the composite signal from the sensed electroacoustic channel signal to thereby generate the second noise estimate.

EEE 75. The system of EEE 74, wherein the second noise estimate is used to update the control filter of the ANC module.

EEE 76. The system of EEE 75, further comprising a first plant model filter operable to filter the second noise estimate prior to updating the control filter.

EEE 77. The system of EEE 76, further comprising a second plant model filter operable to filter the DNC-conditioned signal prior to its application to the second combiner.

EEE 78. The system of EEE 77, further comprising a third plant model filter operable to filter the composite signal prior to its application to the third combiner.

EEE 79. The system of EEE 78, wherein the first, second and third plant model filters have identical filter characteristics.

EEE 80. The system of EEE 73, further comprising a plant model filter operable to filter the DNC-conditioned signal prior to its application to the second combiner.

EEE 81. The system of EEE 74, further comprising a plant model filter operable to filter the composite signal prior to its application to the third combiner.

EEE 82. The system of EEE 72, further comprising a cross correlator operable to selectively limit a level of the first noise estimate.

EEE 83. The system of EEE 82, further comprising an attenuator configured to receive an output of the cross correlator and operable to selectively limit the level of the first noise estimate.

EEE 84. The system of EEE 73, wherein the first noise estimate is a function of a signal detected in the electroacoustic channel, and the second noise estimate is a function of a signal detected upstream of the electroacoustic channel.

EEE 85. The system of EEE 84, wherein the second noise estimate is used to update the control filter of the ANC module.

EEE 86. The system of EEE 72, further comprising a driver configured to receive the composite signal.

EEE 87. The system of EEE 72, wherein the DNC module is operative in the time domain.

EEE 88. The system of EEE 72, wherein the DNC module is operative in the frequency domain.

EEE 89. A system for enhancing a desired audio signal for delivery through an electroacoustic channel, comprising: means for obtaining a noise estimate attributable to an external disturbance; means for applying the noise estimate to a dynamic noise compensation (DNC) process to thereby condition the desired audio signal as a function of the spectral characteristics of the noise estimate; and means for applying the noise estimate to an adaptive equalization (AEQ) process to thereby condition the desired audio signal as a function of the electroacoustic response of the electroacoustic channel.

EEE 90. The system of EEE 89, wherein the noise estimate is generated using means for subtracting, from a sensed electroacoustic channel sound level signal, a filtered and/or delayed output of the DNC process.

EEE 91. The system of EEE 90, wherein the filtered and/or delayed output is filtered by a desired response filter.

EEE 92. The system of EEE 91, wherein the desired response filter has a non-flat frequency response.

EEE 93. The system of EEE 92, further comprising means for applying an output of the DNC process to an adaptive equalization filter of the AEQ process.

EEE 94. The system of EEE 93, further comprising means for selectively limiting the level of the noise estimate applied to the DNC process.

EEE 95. The system of EEE 94, wherein the selective limiting is a function of a convergence of the characteristics of the adaptive equalization filter towards a ratio of the desired response filter to a model of the electroacoustic channel.

EEE 96. The system of EEE 95, wherein convergence is determined using means for cross correlating the noise estimate with an output of the AEQ process.

EEE 97. The system of EEE 96, wherein the selective limiting is achieved using an attenuation means applied to the noise estimate, the attenuation means operating as a function of the cross correlation.

EEE 98. A system for enhancing a desired audio signal for delivery through an electroacoustic channel, comprising: means for obtaining a noise estimate attributable to an external disturbance; means for applying the noise estimate to a dynamic noise compensation (DNC) process to thereby condition the desired audio signal as a function of the spectral characteristics of the noise estimate; means for applying the noise estimate to an adaptive equalization (AEQ) process to thereby condition the desired audio signal as a function of the electroacoustic response of the electroacoustic channel; and means for applying the noise estimate to an active noise cancellation (ANC) process configured to generate anti-noise for delivery into the electroacoustic channel.

EEE 99. The system of EEE 98, wherein the noise estimate is generated using means for subtracting, from a sensed electroacoustic channel sound signal, a filtered and/or delayed output of the DNC process.

EEE 100. The system of EEE 99, wherein the sensed electroacoustic channel sound signal represents sound signal in the acoustic channel after delivery of anti-noise.

EEE 101. The system of EEE 100, wherein the filtered and/or delayed output is filtered by a desired response filter.

EEE 102. The system of EEE 101, wherein the desired response filter has a non-flat frequency response.

EEE 103. The system of EEE 102, further comprising means for applying an output of the DNC process to an adaptive equalization filter of the AEQ process.

EEE 104. The system of EEE 103, further comprising means for selectively limiting the level of the noise estimate applied to the DNC process.

EEE 105. The system of EEE 104, wherein the selective limiting is a function of a convergence of the characteristics of the adaptive equalization filter towards a ratio of the desired response filter to a model of the electroacoustic channel.

EEE 106. The system of EEE 105, wherein convergence is determined using means for cross correlating the noise estimate with an output of the AEQ process.

EEE 107. The system of EEE 106, wherein the selective limiting is achieved using an attenuation means applied to the noise estimate, the attenuation means operating as a function of the cross correlation.

EEE 108. A system for enhancing a desired audio signal for delivery through an electroacoustic channel using a driver, the system comprising: means for obtaining a noise estimate based on an external disturbance; means for generating a dynamic noise compensation (DNC)-conditioned signal by conditioning the desired audio signal as a function of the spectral characteristics of the noise estimate; means for generating an anti-noise signal using the noise estimate; means for generating a composite signal from the DNC-conditioned signal and the anti-noise signal; and means for driving the driver using the composite signal.

EEE 109. The system of EEE 108, wherein the active noise cancellation process is a feedback-based process in which the noise estimate is derived using means for subtracting, from a sensed electroacoustic channel sound level signal, an estimate of the composite signal.

EEE 110. The system of EEE 109, wherein the estimate of the composite signal is generated by means for applying a plant model filter to the composite signal.

EEE 111. The system of EEE 110, wherein the plant model filter is static.

EEE 112. The system of EEE 110, wherein the plant model filter is adaptive.

EEE 113. The system of EEE 111, wherein conditioning the desired audio signal as a function of the spectral characteristics of the noise estimate comprises using means for applying frequency-band specific gain and/or attenuation control of selective portions of the audio signal.

EEE 114. The system of EEE 113, further comprises means for providing selectiveness of a level of aggressiveness of the application of the frequency-band specific gain and/or attenuation control of selective portions of the audio signal.

EEE 115. The system of EEE 108, wherein conditioning the desired audio signal as a function of the spectral characteristics of the noise estimate comprises using means for applying spectral shaping coefficients to the desired audio signal and means for updating the spectral shaping coefficients as a function of the noise estimate and/or the spectral response of the desired sound source.

EEE 116. The system of EEE 115, wherein the spectral coefficients are updated as a function of a plant model.

EEE 117. The system of EEE 116, further comprising means for limiting an amount of frequency-dependent modification applied to the desired audio signal via spectral shaping as a function of the plant model.

EEE 118. The system of EEE 116, further comprising means for applying adaptive equalization as a function of the plant model.

EEE 119. The system of EEE 108, wherein the estimate of the composite signal is generated using means for applying a plant model filter to the composite signal, and wherein conditioning the desired audio signal as a function of the spectral characteristics of the noise estimate comprises using means for applying spectral shaping coefficients to the desired audio signal and updating the spectral shaping coefficients as a function of the noise estimate and/or the spectral response of the desired sound source, the spectral coefficients being updated as a function of a plant model sharing characteristics of the plant model filter.

120. The system of EEE 119, wherein the plant model and plant model filter are updated in relation to one another.

EEE 121. The system of EEE 108, wherein generating an anti-noise signal using the noise estimate comprises using a control filter having coefficients that are updatable in an adaptive filtering process.

EEE 122. The system of EEE 121, wherein the adaptive filtering process comprises a least mean squared (LMS) algorithm.

EEE 123. A system for enhancing a desired audio signal for delivery through an electroacoustic channel using a driver in the presence of a noise disturbance, the system comprising: means for obtaining a first noise estimate based on the external disturbance; means for obtaining a second noise estimate based on the external disturbance; means for generating a DNC-conditioned signal by conditioning the desired audio signal as a function of the spectral characteristics of the first noise estimate; means for generating an anti-noise signal using the first and second noise estimates; means for generating a composite signal from the DNC-conditioned signal and the anti-noise signal; and means for driving the driver using the composite signal, wherein the first noise estimate contains an anti-noise component but no DNC-conditioned component.

EEE 124. The system of EEE 123, wherein generating the anti-noise is conducted in a feed-forward based process in which the second noise estimate is derived from a dedicated transducer.

EEE 125. The system of EEE 123, wherein generating anti-noise is conducted in a feed-back process in which the second noise estimate is derived using means for subtracting, from a sensed electroacoustic channel sound level signal, an estimate of the composite signal.

EEE 126. The system of EEE 125, wherein the estimate of the composite signal is generated using means for applying a plant model filter to the composite signal.

EEE 127. The system of EEE 126, wherein the plant model filter is static.

EEE 128. The system of EEE 126, wherein the plant model filter is adaptive.

EEE 129. The system of EEE 123, further comprising means for selectively limiting the level of the second noise estimate applied to the DNC process.

EEE 130. The system of EEE 129, wherein the selective limiting is achieved using an attenuation means applied to the noise estimate, the attenuation means operating as a function of a cross correlation operation.

EEE 131. A program storage device readable by a machine, embodying a program of instructions executable by the machine to perform a method for enhancing a desired audio signal for delivery through an electroacoustic channel, the method comprising: obtaining a noise estimate attributable to an external disturbance; applying the noise estimate to a dynamic noise compensation (DNC) process to thereby condition the desired audio signal as a function of the spectral characteristics of the noise estimate; and applying the noise estimate to an adaptive equalization (AEQ) process to thereby condition the desired audio signal as a function of the electroacoustic response of the electroacoustic channel.

EEE 132. The device of EEE 131, wherein the noise estimate is generated by: subtracting, from a sensed electroacoustic channel sound level signal, a filtered and/or delayed output of the DNC process.

EEE 133. The device of EEE 131, wherein the method further comprises applying an output of the DNC process to an adaptive equalization filter of the AEQ process.

EEE 134. The device of EEE 131, wherein the method further comprises selectively limiting the level of the noise estimate applied to the DNC process.

EEE 135. The device of EEE 134, wherein the selective limiting is a function of a convergence of the characteristics of the adaptive equalization filter towards a ratio of the desired response filter to a model of the electroacoustic channel.

EEE 136. A program storage device readable by a machine, embodying a program of instructions executable by the machine to perform a method for enhancing a desired audio signal for delivery through an electroacoustic channel, the method comprising: obtaining a noise estimate attributable to an external disturbance; applying the noise estimate to a dynamic noise compensation (DNC) process to thereby condition the desired audio signal as a function of the spectral characteristics of the noise estimate; applying the noise estimate to an adaptive equalization (AEQ) process to thereby condition the desired audio signal as a function of the electroacoustic response of the electroacoustic channel; and applying the noise estimate to an active noise cancellation (ANC) process configured to generate anti-noise for delivery into the electroacoustic channel.

EEE 137. The device of EEE 136, wherein the noise estimate is generated by: subtracting, from a sensed electroacoustic channel sound level signal, a filtered and/or delayed output of the DNC process.

EEE 138. The device of EEE 137, wherein the sensed electroacoustic channel sound level signal represents sounds level in the acoustic channel after delivery of anti-noise.

EEE 139. The device of EEE 136, wherein the method further comprises selectively limiting the level of the noise estimate applied to the DNC process.

EEE 140. The device of EEE 139, wherein the selective limiting is a function of a convergence of the characteristics of the adaptive equalization filter towards a ratio of the desired response filter to a model of the electroacoustic channel.

EEE 141. The device of EEE 140, wherein convergence is determined by cross correlating the noise estimate with an output of the AEQ process.

EEE 142. A program storage device readable by a machine, embodying a program of instructions executable by the machine to perform a method for enhancing a desired audio signal for delivery through an electroacoustic channel using a driver, the method comprising: obtaining a noise estimate based on an external disturbance; generating a dynamic noise compensation (DNC)-conditioned signal by conditioning the desired audio signal as a function of the spectral characteristics of the noise estimate; generating an anti-noise signal using the noise estimate; generating a composite signal from the DNC-conditioned signal and the anti-noise signal; and driving the driver using the composite signal.

EEE 143. The device of EEE 142, wherein the active noise cancellation process is a feedback-based process in which the noise estimate is derived by subtracting, from a sensed electroacoustic channel sound signal, an estimate of the composite signal.

EEE 144. The device of EEE 143, wherein the estimate of the composite signal is generated by applying a plant model filter to the composite signal.

EEE 145. The device of EEE 144, wherein the plant model filter is static.

EEE 146. The device of EEE 144, wherein the plant model filter is adaptive.

EEE 147. The device of EEE 145, wherein conditioning the desired audio signal as a function of the spectral characteristics of the noise estimate comprises applying frequency-band specific gain and/or attenuation control of selective portions of the audio signal.

EEE 148. The device of EEE 147, wherein the method further comprises providing selectiveness of a level of aggressiveness of the application of the frequency-band specific gain and/or attenuation control of selective portions of the audio signal.

EEE 149. The device of EEE 143, wherein conditioning the desired audio signal as a function of the spectral characteristics of the noise estimate comprises applying spectral shaping coefficients to the desired audio signal and updating the spectral shaping coefficients as a function of the noise estimate and/or the spectral response of the desired sound source.

EEE 150. The device of EEE 149, wherein the spectral coefficients are updated as a function of a plant model.

EEE 151. The device of EEE 150, wherein the method further comprises limiting an amount of frequency-dependent modification applied to the desired audio signal via spectral shaping as a function of the plant model.

EEE 152. The device of EEE 144, wherein the method further comprises applying adaptive equalization as a function of the plant model.

EEE 153. The device of EEE 143, wherein the estimate of the composite signal is generated by applying a plant model filter to the composite signal, and wherein conditioning the desired audio signal as a function of the spectral characteristics of the noise estimate comprises applying spectral shaping coefficients to the desired audio signal and updating the spectral shaping coefficients as a function of the noise estimate and/or the spectral response of the desired sound source, the spectral coefficients being updated as a function of a plant model sharing characteristics of the plant model filter.

EEE 154. The device of EEE 153, wherein the plant model and plant model filter are updated in relation to one another.

EEE 155. The device of EEE 143, wherein generating an anti-noise signal using the noise estimate comprises using a control filter having coefficients that are updatable in an adaptive filtering process.

EEE 156. The device of EEE 155, wherein the adaptive filtering process comprises a least mean squared (LMS) algorithm.

EEE 157. A program storage device readable by a machine, embodying a program of instructions executable by the machine to perform a method for enhancing a desired audio signal for delivery through an electroacoustic channel using a driver in the presence of a noise disturbance, the method comprising: obtaining a first noise estimate based on the external disturbance; obtaining a second noise estimate based on the external disturbance; generating a DNC-conditioned signal by conditioning the desired audio signal as a function of the spectral characteristics of the first noise estimate; generating an anti-noise signal using the first and second noise estimates; generating a composite signal from the DNC-conditioned signal and the anti-noise signal; and driving the driver using the composite signal, wherein the first noise estimate contains an anti-noise component but no DNC-conditioned component.

EEE 158. The device of EEE 157, wherein generating the anti-noise is conducted in a feed-forward based process in which the second noise estimate is derived from a dedicated transducer.

EEE 160. The device of EEE 157, wherein generating anti-noise is conducted in a feed-back process in which the second noise estimate is derived by subtracting, from a sensed electroacoustic channel sound level signal, an estimate of the composite signal.

EEE 161. The device of EEE 160, wherein the estimate of the composite signal is generated by applying a plant model filter to the composite signal.

EEE 162. The device of EEE 161, wherein the plant model filter is static.

EEE 163. The device of EEE 161, wherein the plant model filter is adaptive.

EEE 164. The device of EEE 157, wherein the method further comprises selectively limiting the level of the second noise estimate applied to the DNC process.

EEE 165. The device of EEE 164, wherein the selective limiting is achieved using an attenuator applied to the noise estimate, the attenuator operating as a function of a cross correlation operation.

What is claimed is:

1. A method for enhancing a desired audio signal for delivery through an electroacoustic channel, comprising:

obtaining a noise estimate attributable to an external disturbance;

applying the noise estimate and the desired audio signal to a dynamic noise compensation (DNC) process to thereby generate a DNC-conditioned desired audio signal as a function of the spectral characteristics of the noise estimate; and applying the noise estimate and the DNC-conditioned desired audio signal to an adaptive equalization (AEQ) process to thereby generate the enhanced desired audio signal as a function of the electroacoustic response of the electroacoustic channel.

2. The method of claim 1, further comprising:

applying the noise estimate to an active noise cancellation (ANC) process configured to generate anti-noise for delivery into the electroacoustic channel.

3. The method of claim 1, wherein the noise estimate is generated by:

subtracting, from a sensed electroacoustic channel sound signal, a filtered and/or delayed output of the DNC process.

4. The method of claim 3, wherein the filtered and/or delayed output is filtered by a desired response filter having a non-flat frequency response.

5. The method of claim 4, further comprising applying an output of the DNC process to an adaptive equalization filter of the AEQ process.

6. A method for enhancing a desired audio signal for delivery through an electroacoustic channel using a driver, the method comprising:

obtaining a noise estimate based on an external disturbance;

applying the noise estimate and the desired audio signal to a dynamic noise compensation (DNC) process to generate a dynamic noise compensation (DNC)-conditioned desired signal by conditioning the desired audio signal as a function of the spectral characteristics of the noise estimate;

generating an anti-noise signal using the noise estimate;

combining the DNC-conditioned desired signal and the anti-noise signal to generate a composite signal; and driving the driver using the composite signal.

7. The method of claim 6, wherein generating an anti-noise signal using the noise estimate constitutes an active noise cancellation process that is a feedback-based process in which the noise estimate is derived by subtracting, from a sensed electroacoustic channel sound level signal, an estimate of the composite signal.

8. The method of claim 6, wherein conditioning the desired audio signal as a function of the spectral characteristics of the noise estimate comprises applying frequency-band specific gain and/or attenuation control of selective portions of the audio signal.

9. The method of claim 6, further comprising applying adaptive equalization as a function of a plant model.

10. A method for enhancing a desired audio signal for delivery through an electroacoustic channel using a driver in the presence of a noise disturbance, the method comprising:

obtaining a first noise estimate based on the external disturbance;

obtaining a second noise estimate based on the external disturbance;

generating a dynamic noise compensation (DNC)-conditioned signal by conditioning the desired audio signal as a function of the spectral characteristics of the first noise estimate;

generating an anti-noise signal using the first and second noise estimates;

generating a composite signal from the DNC-conditioned signal and the anti-noise signal; and driving the driver using the composite signal, wherein the first noise estimate contains an anti-noise component but no DNC-conditioned component.

11. The method of claim 10, wherein one or both of the first and second noise estimates are derived in response to a plant model filter characterized at least in part by the electroacoustic channel.

12. The method of claim 10, wherein generating the anti-noise is conducted in a feed-forward based process in which the second noise estimate is derived from a dedicated transducer.

13. The method of claim 10, wherein generating anti-noise is conducted in a feed-back process in which the second noise estimate is derived by subtracting, from a sensed electroacoustic channel sound level signal, an estimate of the composite signal.

14. An audio enhancement system for enhancing a desired audio signal, comprising:

a dynamic noise compensation (DNC) module configured to receive a first noise estimate and the desired audio signal, and to generate a DNC-conditioned signal, the DNC module including a spectral shaping filter operable to apply spectral shaping to the desired audio signal based on spectral characteristics of the first noise estimate; and an adaptive equalization (AEQ) module configured to receive the first noise estimate and the DNC-conditioned signal, and to generate an AEQ-conditioned signal, the AEQ module including an adaptive equalization control filter operable to receive the DNC-conditioned signal and apply thereto adaptive equalization as a function of the first noise estimate.

15. The system of claim 14, wherein the adaptive equalization filter is updatable using a first update signal that is a function of an electroacoustic response of an electroacoustic channel.

16. The system of claim 14, further including:

an active noise cancellation module configured to generate an anti-noise signal based on the first noise estimate; and a combiner operable to combine the anti-noise signal with the AEQ-conditioned signal.

17. The system of claim 14, further comprising:

a cross correlator operable to selectively limit a level of the first noise estimate based on a convergence operation of the adaptive equalization control filter; and a desired response filter configured to receive the DNC-conditioned signal, the convergence operation being a convergence of the characteristics of the adaptive equalization control filter towards a ratio of the desired response filter to a model of the electroacoustic channel.

18. An audio enhancement system for enhancing a desired audio signal for delivery through an electroacoustic channel, comprising:

a dynamic noise compensation (DNC) module configured to generate a DNC-conditioned signal, the DNC module including a spectral shaping filter operable to apply spectral shaping to the desired audio signal based on spectral characteristics of a first noise estimate;

an active noise cancellation (ANC) module including a control filter having filter characteristics updatable by the first noise estimate and having a first input for receiving a second noise estimate and generating therefrom an anti-noise signal; and a first combiner for combining the DNC-conditioned signal and the anti-noise signal to generate a composite signal.

19. The system of claim 18, further comprising a second combiner operable to subtract the DNC-conditioned signal from a sensed electroacoustic channel signal to thereby generate the first noise estimate.

20. The system of claim 19, further comprising a third combiner for subtracting the composite signal from the sensed electroacoustic channel signal to thereby generate the second noise estimate.

* * * * *